(12) United States Patent
Arasawa et al.

(10) Patent No.: US 10,411,158 B2
(45) Date of Patent: *Sep. 10, 2019

(54) LIGHT-EMITTING DISPLAY DEVICE HAVING OXIDE SEMICONDUCTOR LAYER OVERLAPPING WITH ADJACENT PIXEL ELECTRODE

(71) Applicant: Semiconductor Energy Laboratory Co., Ltd., Atsugi-shi, Kanagawa-ken (JP)

(72) Inventors: Ryo Arasawa, Kanagawa (JP); Hideaki Shishido, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/131,119

(22) Filed: Apr. 18, 2016

(65) Prior Publication Data

US 2016/0233239 A1 Aug. 11, 2016

Related U.S. Application Data

(60) Division of application No. 13/936,355, filed on Jul. 8, 2013, now Pat. No. 9,318,654, which is a
(Continued)

(30) Foreign Application Priority Data

Oct. 9, 2009 (JP) .................................. 2009-235180

(51) Int. Cl.
*H01L 27/12* (2006.01)
*H01L 33/16* (2010.01)

(52) U.S. Cl.
CPC ............ *H01L 33/16* (2013.01); *H01L 27/124* (2013.01); *H01L 27/1225* (2013.01)

(58) Field of Classification Search
CPC ............... H01L 27/124; H01L 27/1225; H01L 29/7869; H01L 29/78696; H01L 27/3248;
(Continued)

(56) References Cited

U.S. PATENT DOCUMENTS 4,935,792 A 6/1990 Tanaka et al.
5,357,136 A 10/1994 Yoshioka
(Continued)

FOREIGN PATENT DOCUMENTS

CN 001278660 A 1/2001
CN 001773714 A 5/2006
(Continued)

OTHER PUBLICATIONS

Korean Office Action (Application No. 2016-7036062) dated Feb. 27, 2017.
(Continued)

*Primary Examiner* — Khiem D Nguyen
(74) *Attorney, Agent, or Firm* — Fish & Richardson P.C.

(57) ABSTRACT

An object is to provide a light-emitting display device in which a pixel including a thin film transistor using an oxide semiconductor has a high aperture ratio. The light-emitting display device includes a plurality of pixels each including a thin film transistor and a light-emitting element. The pixel is electrically connected to a first wiring functioning as a scan line. The thin film transistor includes an oxide semiconductor layer over the first wiring with a gate insulating film therebetween. The oxide semiconductor layer is extended beyond the edge of a region where the first wiring is provided. The light-emitting element and the oxide semiconductor layer overlap with each other.

15 Claims, 12 Drawing Sheets

Related U.S. Application Data continuation of application No. 12/897,299, filed on Oct. 4, 2010, now Pat. No. 8,482,004.

(58) Field of Classification Search
CPC ............ H01L 27/3241; H01L 27/3244; H01L 27/3276; H01L 29/42384; H01L 29/78693; H01L 29/78648; H01L 29/4908; H01L 21/02565
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,821,559 A | 10/1998 | Yamazaki et al. | |
| 5,854,494 A | 12/1998 | Yamazaki et al. | |
| 6,028,333 A | 2/2000 | Yamazaki et al. | |
| 6,115,088 A | 9/2000 | Zhang et al. | |
| 6,294,274 B1 | 9/2001 | Kawazoe et al. | |
| 6,326,642 B1 | 12/2001 | Yamazaki et al. | |
| 6,421,101 B1 | 7/2002 | Zhang et al. | |
| 6,563,174 B2 | 5/2003 | Kawasaki et al. | |
| 6,570,184 B2 | 5/2003 | Horikoshi et al. | |
| 6,608,653 B2 | 8/2003 | Shiga et al. | |
| 6,618,029 B1 | 9/2003 | Ozawa | |
| 6,657,260 B2 | 12/2003 | Yamazaki et al. | |
| 6,689,492 B1 | 2/2004 | Yamazaki et al. | |
| 6,724,443 B1 | 4/2004 | Sano et al. | |
| 6,727,522 B1 | 4/2004 | Kawasaki et al. | |
| 6,737,306 B2 | 5/2004 | Yamazaki et al. | |
| 6,788,355 B1 | 9/2004 | Ihida et al. | |
| 6,861,299 B2 | 3/2005 | Horikoshi et al. | |
| 6,888,160 B1 | 5/2005 | Nakajima et al. | |
| 6,913,956 B2 | 7/2005 | Hamada et al. | |
| 6,953,713 B2 | 10/2005 | Yamazaki et al. | |
| 7,023,021 B2 | 4/2006 | Yamazaki et al. | |
| 7,023,502 B2 | 4/2006 | Zhang et al. | |
| 7,046,313 B2 | 5/2006 | Zhang et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,147,530 B2 | 12/2006 | Yamazaki et al. | |
| 7,211,825 B2 | 5/2007 | Shih et al. | |
| 7,223,996 B2 | 5/2007 | Yamazaki et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,397,451 B2 | 7/2008 | Ozawa | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,460,094 B2 | 12/2008 | Ozawa | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,566,903 B2 | 7/2009 | Yamazaki et al. | |
| 7,566,904 B2 | 7/2009 | Ishii | |
| 7,585,698 B2 | 9/2009 | Ishii | |
| 7,601,984 B2 | 10/2009 | Sano et al. | |
| 7,674,650 B2 | 3/2010 | Akimoto et al. | |
| 7,687,808 B2 | 3/2010 | Umezaki | |
| 7,723,151 B2 | 5/2010 | Lee | |
| 7,732,819 B2 | 6/2010 | Akimoto et al. | |
| 7,737,517 B2 | 6/2010 | Kawamura et al. | |
| 7,795,621 B2 | 9/2010 | Yamaguchi et al. | |
| 7,825,588 B2 * | 11/2010 | Yamazaki ............ | H01L 27/1214 313/498 |
| 7,859,187 B2 | 12/2010 | Yamazaki et al. | |
| 7,863,618 B2 | 1/2011 | Zhang et al. | |
| 7,872,722 B2 | 1/2011 | Kimura | |
| 7,910,490 B2 | 3/2011 | Akimoto et al. | |
| 7,915,615 B2 | 3/2011 | Yamazaki et al. | |
| 7,932,521 B2 | 4/2011 | Akimoto et al. | |
| 8,097,881 B2 | 1/2012 | Lee et al. | |
| 8,130,354 B2 | 3/2012 | Kimura | |
| 8,143,115 B2 | 3/2012 | Omura et al. | |
| 8,148,721 B2 | 4/2012 | Hayashi et al. | |
| 8,149,346 B2 | 4/2012 | Kimura | |
| 8,203,265 B2 | 6/2012 | Yamazaki et al. | |
| 8,274,077 B2 | 9/2012 | Akimoto et al. | |
| 8,310,475 B2 | 11/2012 | Ozawa | |
| 8,310,476 B2 | 11/2012 | Ozawa | |
| 8,334,858 B2 | 12/2012 | Ozawa | |
| 8,399,884 B2 | 3/2013 | Yamazaki et al. | |
| 8,421,350 B2 | 4/2013 | Yamazaki et al. | |
| 8,466,463 B2 | 6/2013 | Akimoto et al. | |
| 8,482,004 B2 * | 7/2013 | Arasawa ............ | H01L 27/1225 257/59 |
| 8,536,577 B2 | 9/2013 | Zhang et al. | |
| 8,576,347 B2 | 11/2013 | Kimura | |
| 8,586,985 B2 | 11/2013 | Zhang et al. | |
| 8,629,069 B2 | 1/2014 | Akimoto et al. | |
| 8,669,550 B2 | 3/2014 | Akimoto et al. | |
| 8,674,600 B2 | 3/2014 | Yamazaki et al. | |
| 8,704,233 B2 | 4/2014 | Yamazaki et al. | |
| 8,780,307 B2 | 7/2014 | Kimura | |
| 8,790,959 B2 | 7/2014 | Akimoto et al. | |
| 8,796,069 B2 | 8/2014 | Akimoto et al. | |
| 8,885,114 B2 | 11/2014 | Kimura | |
| 9,099,562 B2 | 8/2015 | Akimoto et al. | |
| 9,318,610 B2 | 4/2016 | Yamazaki et al. | |
| 9,318,654 B2 | 4/2016 | Arasawa et al. | |
| 9,869,907 B2 | 1/2018 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0042484 A1 | 3/2003 | Horikoshi et al. | |
| 2003/0062524 A1* | 4/2003 | Kimura ............... | G09G 3/2022 257/72 |
| 2003/0151568 A1 | 8/2003 | Ozawa | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0043510 A1 | 3/2006 | Yamazaki et al. | |
| 2006/0081846 A1 | 4/2006 | Yamazaki et al. | |
| 2006/0091397 A1 | 5/2006 | Akimoto et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1* | 8/2006 | Isa ...................... | H01L 51/0022 257/40 |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0146566 A1 | 6/2007 | Hosoya | |
| 2007/0152217 A1* | 7/2007 | Lai ...................... | H01L 27/1225 257/59 |

(56) References Cited

U.S. PATENT DOCUMENTS

| | | |
|---|---|---|
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0241457 A1 | 10/2007 | Ida |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0012076 A1 | 1/2008 | Yamazaki et al. |
| 2008/0036698 A1 | 2/2008 | Kawasaki et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0057618 A1* | 3/2008 | Honda ............... H01L 27/1225 438/104 |
| 2008/0073653 A1* | 3/2008 | Iwasaki ............... H01L 29/7869 257/79 |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0158137 A1* | 7/2008 | Yoshida ............... G09G 3/3413 345/102 |
| 2008/0158138 A1 | 7/2008 | Yamazaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0225061 A1 | 9/2008 | Kimura et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308804 A1* | 12/2008 | Akimoto ............... H01L 27/1225 257/59 |
| 2008/0308805 A1 | 12/2008 | Akimoto et al. |
| 2009/0001881 A1 | 1/2009 | Nakayama |
| 2009/0068773 A1 | 3/2009 | Lai et al. |
| 2009/0073325 A1 | 3/2009 | Kuwabara et al. |
| 2009/0101895 A1* | 4/2009 | Kawamura ......... H01L 27/1225 257/43 |
| 2009/0114910 A1 | 5/2009 | Chang |
| 2009/0114911 A1* | 5/2009 | Maekawa ......... H01L 29/41733 257/43 |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0224245 A1 | 9/2009 | Umezaki |
| 2009/0230392 A1 | 9/2009 | Takahara |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0032664 A1 | 2/2010 | Lee et al. |
| 2010/0065844 A1 | 3/2010 | Tokunaga |
| 2010/0072471 A1 | 3/2010 | Yamazaki et al. |
| 2010/0084651 A1* | 4/2010 | Yamazaki ......... H01L 27/1225 257/43 |
| 2010/0092800 A1 | 4/2010 | Itagaki et al. |
| 2010/0109002 A1 | 5/2010 | Itagaki et al. |
| 2010/0295042 A1 | 11/2010 | Yano et al. |
| 2010/0301326 A1* | 12/2010 | Miyairi ............... H01L 27/1225 257/43 |
| 2011/0085104 A1 | 4/2011 | Arasawa et al. |
| 2011/0104851 A1 | 5/2011 | Akimoto et al. |
| 2011/0121290 A1 | 5/2011 | Akimoto et al. |
| 2011/0124138 A1 | 5/2011 | Takahara |
| 2012/0168750 A1 | 7/2012 | Hayashi et al. |
| 2013/0277672 A1 | 10/2013 | Sano et al. |
| 2014/0313445 A1 | 10/2014 | Kimura |
| 2015/0129883 A1 | 5/2015 | Kimura |
| 2015/0340513 A1 | 11/2015 | Akimoto et al. |
| 2017/0243897 A1* | 8/2017 | Yamazaki ........... H01L 27/1225 |

FOREIGN PATENT DOCUMENTS

| | | |
|---|---|---|
| CN | 001776916 A | 5/2006 |
| CN | 001906650 A | 1/2007 |
| CN | 101055857 A | 10/2007 |
| CN | 101057339 A | 10/2007 |
| CN | 101221960 A | 7/2008 |
| CN | 101369590 A | 2/2009 |
| CN | 101548389 A | 9/2009 |
| EP | 0935229 A | 8/1999 |
| EP | 1058484 A | 12/2000 |
| EP | 1128430 A | 8/2001 |
| EP | 1209748 A | 5/2002 |
| EP | 1505650 A | 2/2005 |
| EP | 1505651 A | 2/2005 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2112693 A | 10/2009 |
| EP | 2226847 A | 9/2010 |
| EP | 2296443 A | 3/2011 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-122754 A | 5/1995 |
| JP | 08-264794 A | 10/1996 |
| JP | 10-078593 A | 3/1998 |
| JP | 10-082991 A | 3/1998 |
| JP | 10-148847 A | 6/1998 |
| JP | 11-024606 A | 1/1999 |
| JP | 11-112002 A | 4/1999 |
| JP | 11-505377 | 5/1999 |
| JP | 2000-044236 A | 2/2000 |
| JP | 2000-150900 A | 5/2000 |
| JP | 2001-036087 A | 2/2001 |
| JP | 2001-052873 A | 2/2001 |
| JP | 2001-117115 A | 4/2001 |
| JP | 2001-125134 A | 5/2001 |
| JP | 2002-076356 A | 3/2002 |
| JP | 2002-289859 A | 10/2002 |
| JP | 2003-050405 A | 2/2003 |
| JP | 2003-069030 A | 3/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-019627 A | 1/2005 |
| JP | 2005-077822 A | 3/2005 |
| JP | 2006-165529 A | 6/2006 |
| JP | 2006-242987 A | 9/2006 |
| JP | 2007-123861 A | 5/2007 |
| JP | 2007-133371 A | 5/2007 |
| JP | 2007-334082 A | 12/2007 |
| JP | 2008-042043 A | 2/2008 |
| JP | 2008-116502 A | 5/2008 |
| JP | 2008-181109 A | 8/2008 |
| JP | 2009-021612 A | 1/2009 |
| JP | 2009-031750 A | 2/2009 |
| JP | 2009-065012 A | 3/2009 |
| JP | 2009-099887 A | 5/2009 |
| JP | 2009-224595 A | 10/2009 |
| JP | 5926831 | 5/2016 |
| KR | 2006-0052371 A | 5/2006 |

(56) References Cited

FOREIGN PATENT DOCUMENTS

| | | |
|---|---|---|
| KR | 2007-0104310 A | 10/2007 |
| KR | 2007-0107058 A | 11/2007 |
| WO | WO-2004/114391 | 12/2004 |
| WO | WO-2005/048221 | 5/2005 |
| WO | WO-2006/051993 | 5/2006 |
| WO | WO-2006/093028 | 9/2006 |
| WO | WO-2006/132439 | 12/2006 |
| WO | WO-2008/069056 | 6/2008 |
| WO | WO-2008/069255 | 6/2008 |
| WO | WO-2009/028452 | 3/2009 |
| WO | WO-2009/093625 | 7/2009 |
| WO | WO-2011/043216 | 4/2011 |

OTHER PUBLICATIONS

International Search Report (Application No. PCT/JP2010/066744) dated Dec. 7, 2010.

Written Opinion (Application No. PCT/JP2010/066744) dated Dec. 7, 2010.

International Search Report (Application No. PCT/JP2010/066746) dated Nov. 30, 2010.

Written Opinion (Application No. PCT/JP2010/066746) dated Nov. 30, 2010.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW'02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-emitting Devices Employing MoO3 as a Charge-generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Perfromance TFT", SID Digest '07 : SID International Symposium Digest of Technical Papers, 2007, vol. 38, pp. 1830-1833.

Hirao.T et al., "Novel Top-gate Zinc Oxide Thin-film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-state Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications",

(56) References Cited

OTHER PUBLICATIONS

SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies In ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Office Action (U.S. Appl. No. 12/897,289) dated Aug. 8, 2012.
Chinese Office Action (Application No. 201080045810.9) dated Mar. 17, 2014.
Taiwanese Office Action (Application No. 099134226) dated Dec. 4, 2015.
Korean Office Action (Application No. 2012-7011625) dated Oct. 25, 2016.

* cited by examiner

LIGHT-EMITTING DISPLAY DEVICE HAVING OXIDE SEMICONDUCTOR LAYER OVERLAPPING WITH ADJACENT PIXEL ELECTRODE

CROSS-REFERENCE TO RELATED APPLICATIONS

This application is a divisional of U.S. application Ser. No. 13/936,355, filed Jul. 8, 2013, now U.S. Pat. No. 9,318,654 which is a continuation of U.S. application Ser. No. 12/897,299, filed Oct. 4, 2010, now U.S. Pat. No. 8,482,004, which claims the benefit of a foreign priority application filed in Japan as Serial No. 2009-235180 on Oct. 9, 2009, all of which are incorporated by reference.

TECHNICAL FIELD

The present invention relates to a light-emitting display device. In addition, the present invention relates to an electronic device including the light-emitting display device.

BACKGROUND ART

A thin film transistor formed over a flat plate such as a glass substrate is manufactured using amorphous silicon or polycrystalline silicon, as typically seen in a liquid crystal display device. A thin film transistor manufactured using amorphous silicon has low field effect mobility, but can be formed over a larger glass substrate. In contrast, a thin film transistor manufactured using crystalline silicon has high field effect mobility, but needs a crystallization step such as laser annealing and is not always suitable for a larger glass substrate.

In view of the above, attention has been drawn to a technique by which a thin film transistor is manufactured using an oxide semiconductor and applied to an electronic device or an optical device. For example, Patent Document 1 discloses a technique by which a thin film transistor is manufactured using zinc oxide or an In—Ga—Zn—O-based oxide semiconductor for an oxide semiconductor film and such a transistor is used as a switching element or the like of a light-emitting display device.

REFERENCE

Patent Document 1: Japanese Published Patent Application No. 2009-031750

DISCLOSURE OF INVENTION

The field effect mobility of a thin film transistor in which an oxide semiconductor is used for a channel region is higher than that of a thin film transistor in which amorphous silicon is used for a channel region. A pixel including such a thin film transistor formed using an oxide semiconductor is expected to be applied to a light-emitting display device such as an EL display. Furthermore, although the area per pixel is expected to decrease in a higher value-added light-emitting display device such as a 3D display or a 4K2K display, a light-emitting display device including a pixel with increased aperture ratio is desired.

In view of the foregoing, an object of the present invention is to provide a light-emitting display device in which a pixel including a thin film transistor using an oxide semiconductor has a high aperture ratio.

According to one embodiment of the present invention, a light-emitting display device includes a pixel including a thin film transistor and a light-emitting element. The pixel is electrically connected to a first wiring functioning as a scan line. The thin film transistor includes an oxide semiconductor layer over the first wiring with a gate insulating film therebetween. The oxide semiconductor layer is extended beyond the edge of a region where the first wiring is provided. The light-emitting element and the oxide semiconductor layer overlap with each other.

According to one embodiment of the present invention, a light-emitting display device includes a pixel including a thin film transistor and a light-emitting element. The pixel is electrically connected to a first wiring functioning as a scan line and a second wiring functioning as a signal line. The thin film transistor includes an oxide semiconductor layer over the first wiring with a gate insulating film therebetween. The oxide semiconductor layer is extended beyond the edge of a region where the first wiring is provided. The second wiring is extended over the gate insulating film over the first wiring and is on and in contact with the oxide semiconductor layer. The light-emitting element and the oxide semiconductor layer overlap with each other.

According to one embodiment of the present invention, a light-emitting display device includes a thin film transistor and a light-emitting element. The pixel is electrically connected to a first wiring functioning as a scan line and a second wiring functioning as a signal line. The thin film transistor includes an oxide semiconductor layer over the first wiring with a gate insulating film therebetween. The oxide semiconductor layer is extended beyond the edge of a region where the first wiring is provided. The second wiring is extended over the gate insulating film over the first wiring and an interlayer insulating layer over the gate insulating film, and is on and in contact with the oxide semiconductor layer. The light-emitting element and the oxide semiconductor layer overlap with each other.

According to one embodiment of the present invention, a light-emitting display device includes a pixel including a first thin film transistor, a second thin film transistor, and a light-emitting element. The pixel is electrically connected to a first wiring functioning as a scan line and a second wiring functioning as a signal line. The first thin film transistor includes an oxide semiconductor layer over the first wiring with a gate insulating film therebetween. The oxide semiconductor layer is extended beyond the edge of a region where the first wiring is provided. The second wiring is extended over the gate insulating film over the first wiring and is on and in contact with the oxide semiconductor layer. A third wiring that is in contact with the oxide semiconductor layer and electrically connects the first thin film transistor and the second thin film transistor is extended over the gate insulating film over the first wiring. The light-emitting element and the oxide semiconductor layer overlap with each other.

According to one embodiment of the present invention, a light-emitting display device includes a thin film transistor and a light-emitting element. The pixel is electrically connected to a first wiring functioning as a scan line and a second wiring functioning as a signal line. The thin film transistor includes an oxide semiconductor layer over the first wiring with a gate insulating film therebetween. The oxide semiconductor layer is extended beyond the edge of a region where the first wiring is provided. The second wiring is extended over the gate insulating film over the first wiring and an interlayer insulating layer over the gate insulating film, and is on and in contact with the oxide semiconductor layer. A third wiring that is in contact with the oxide semiconductor layer and electrically connects the first thin film transistor and the second thin film transistor is extended over the gate insulating film over the first wiring and the interlayer insulating layer over the gate insulating film. The light-emitting element and the oxide semiconductor layer overlap with each other.

It is possible to increase the aperture ratio of a pixel including a thin film transistor in which an oxide semiconductor is used. Thus, a light-emitting display device can include a high definition display portion.

BEST MODE FOR CARRYING OUT THE INVENTION

Figure 1A:
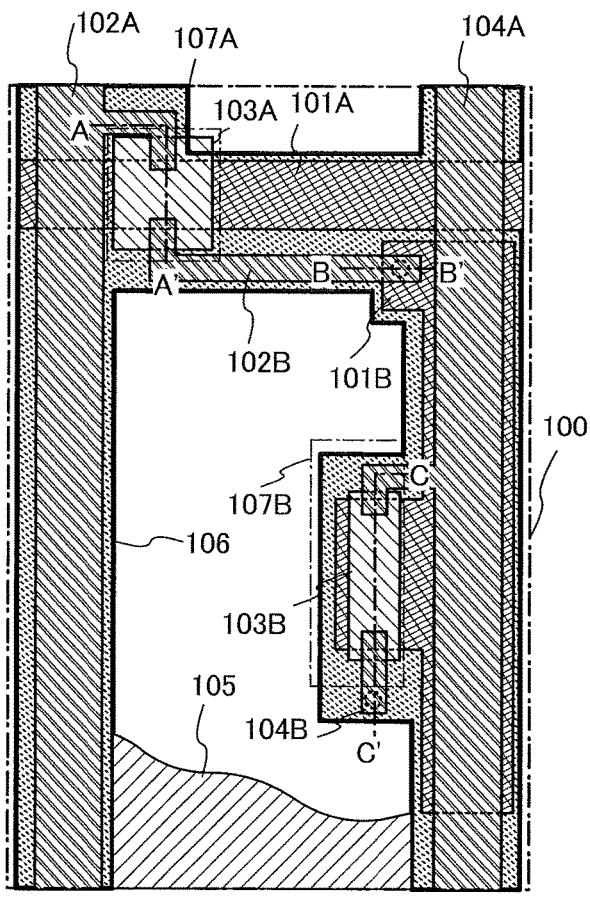
FIGS. 1A and 1B are a top view and a cross-sectional view of a light-emitting display device.

Embodiments of the present invention will be described in detail with reference to the accompanying drawings. The present invention is not limited to the following description, and it is easily understood by those skilled in the art that modes and details disclosed herein can be modified in various ways without departing from the spirit and the scope of the present invention. Therefore, the present invention is not to be construed as being limited to the content of the embodiments included herein. Note that in the structures of the present invention described below, the same reference numerals are used for the same portions and portions having similar functions in different drawings, and the description thereof is not repeated.

Note that the size, the thickness of a layer, or a region of each structure illustrated in drawings in this specification is exaggerated for simplicity in some cases. Therefore, embodiments of the present invention are not limited to such scales.

Note that the terms such as "first", "second", and "third" used in this specification are used in order to avoid confusion of structural elements and do not mean limitation of the number of the structural elements. Therefore, for example, the term "first" can be replaced with the term "second", "third", or the like as appropriate.

Embodiment 1

In this embodiment, a light-emitting display device will be described using a pixel that includes a thin film transistor (hereinafter also referred to as a TFT) and a light-emitting element connected to the TFT, as an example. Note that a pixel refers to an element group that is composed of elements provided in each pixel of a display device, for example, elements for controlling display in accordance with an electric signal, such as a thin film transistor, a light-emitting element, and a wiring. A pixel may include a color filter or the like and may correspond to one color component whose brightness can be controlled with one pixel. Therefore, for example, in a color display device including color elements of R, G, and B, a minimum unit of an image is composed of three pixels of an R pixel, a G pixel, and a B pixel and an image can be obtained with a plurality of pixels.

Note that a light-emitting element includes a light-emitting layer between a pair of electrodes (an anode and a cathode), and is formed by stacking an element included in the light-emitting layer over one of the electrodes. In this specification, one of electrodes of a light-emitting element shown in a drawing is sometimes referred to as a "light-emitting element".

Note that when it is described that "A and B are connected", the case where A and B are electrically connected to each other, and the case where A and B are directly connected to each other are included therein. Here, A and B are each an object having an electrical function. Specifically, the description "A and B are connected" includes the case where a portion between A and B can be regarded as one node in consideration of circuit operation, for example, the case where A and B are connected through a switching element such as a transistor and have the same or substantially the same potentials by conduction of the switching element, and the case where A and B are connected through a resistor and the potential difference generated at opposite ends of the resistor does not adversely affect the operation of a circuit including A and B.

FIG. 1A is a top view of a pixel. A TFT illustrated in FIG. 1A has a kind of bottom-gate structure called an inverted staggered structure in which a wiring layer serving as a source electrode and a drain electrode of the TFT is placed opposite to an oxide semiconductor layer serving as a channel region, with respect to a wiring serving as a gate.

A pixel 100 illustrated in FIG. 1A includes a first wiring 101A functioning as a scan line, a second wiring 102A functioning as a signal line, a first oxide semiconductor layer 103A, a second oxide semiconductor layer 103B, a power supply line 104A, a capacitor electrode 101B, and a light-emitting element 105. Moreover, the pixel 100 in FIG. 1A includes a third wiring 102B for electrically connecting the first oxide semiconductor layer 103A and the capacitor electrode 101B, so that a first thin film transistor 107A is formed. Furthermore, the pixel 100 in FIG. 1A includes a fourth wiring 104B for electrically connecting the second oxide semiconductor layer 103B and the light-emitting element 105, so that a second thin film transistor 107B is formed.

A partition 106 for separating light-emitting elements for each pixel is provided over the first wiring 101A, the second wiring 102A, the third wiring 102B, the fourth wiring 104B, the first oxide semiconductor layer 103A, the second oxide semiconductor layer 103B, the power supply line 104A, and the capacitor electrode 101B. Note that the light-emitting element 105 connected to the fourth wiring 104B is surrounded by the partition 106.

The first wiring 101A also functions as a gate of the first thin film transistor 107A. The capacitor electrode 101B is also a wiring that functions as a gate of the second thin film transistor 107B and one electrode of a capacitor. The second wiring 102A also functions as one of a source electrode and a drain electrode of the first thin film transistor 107A. The third wiring 102B also functions as the other of the source electrode and the drain electrode of the first thin film transistor 107A. The power supply line 104A is also a wiring that functions as one of a source electrode and a drain electrode of the second thin film transistor 107B and the other electrode of the capacitor. The fourth wiring 104B also functions as the other of the source electrode and the drain electrode of the second thin film transistor 107B.

Note that the first wiring 101A and the capacitor electrode 101B are formed from the same layer; the second wiring 102A, the third wiring 102B, the power supply line 104A, and the fourth wiring 104B are formed from the same layer. In addition, the power supply line 104A and the capacitor electrode 101B partly overlap with each other to form a storage capacitor of the second thin film transistor 107B.

The first oxide semiconductor layer 103A included in the first thin film transistor 107A is provided over the first wiring 101A with a gate insulating film (not illustrated) therebetween. The first oxide semiconductor layer 103A is extended beyond the edge of a region where the first wiring 101A is provided and the partition 106.

Note that the description "A is extended beyond the edge of B" means that, when stacked A and B are seen in a top view, edges of A and B are not aligned and A is extended outward so that the edge of A is placed outside the edge of B.

Note that the pixel may include a plurality of thin film transistors in addition to the first thin film transistor 107A and the second thin film transistor 107B. Note that the first thin film transistor 107A has a function of selecting a pixel including the first thin film transistor 107A, and is also referred to as a selection transistor. The second thin film transistor 107B has a function of controlling a current flowing to the light-emitting element 105 in a pixel including the second thin film transistor 107B, and is also referred to as a driving transistor.

Figure 1B:
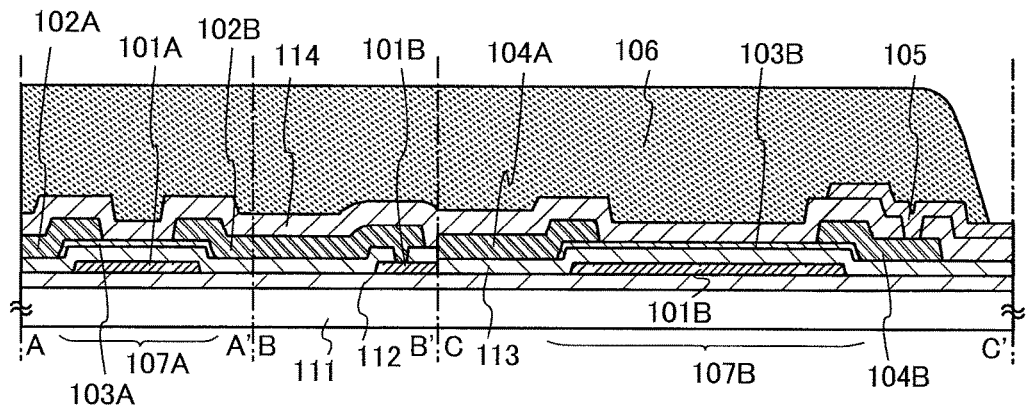

FIG. 1B illustrates a cross-sectional structure along chain lines A-A', B-B', and C-C' in FIG. 1A. In the cross-sectional structure illustrated in FIG. 1B, the first wiring 101A serving as the gate and the capacitor electrode 101B are provided over a substrate 111 with a base film 112 therebetween. A gate insulating film 113 is provided so as to cover the first wiring 101A and the capacitor electrode 101B. The first oxide semiconductor layer 103A and the second oxide semiconductor layer 103B are provided over the gate insulating film 113. The second wiring 102A and the third wiring 102B are provided over the first oxide semiconductor layer 103A, and the power supply line 104A and the fourth wiring 104B are provided over the second oxide semiconductor layer 103B. An oxide insulating layer 114 functioning as a passivation film is provided over the first oxide semiconductor layer 103A, the second oxide semiconductor layer 103B, the second wiring 102A, the third wiring 102B, the power supply line 104A, and the fourth wiring 104B. The partition 106 is provided over the oxide insulating layer 114 over the first wiring 101A, the second wiring 102A, the third wiring 102B, the fourth wiring 104B, the first oxide semiconductor layer 103A, the second oxide semiconductor layer 103B, the power supply line 104A, and the capacitor electrode 101B. An opening portion is formed in the oxide insulating layer 114 over the fourth wiring 104B. The electrode of the light-emitting element 105 and the fourth wiring 104B are connected in the opening portion. In the cross section along chain line B-B', the third wiring 102B and the capacitor electrode 101B are connected through an opening portion formed in the gate insulating film 113.

Figure 7:
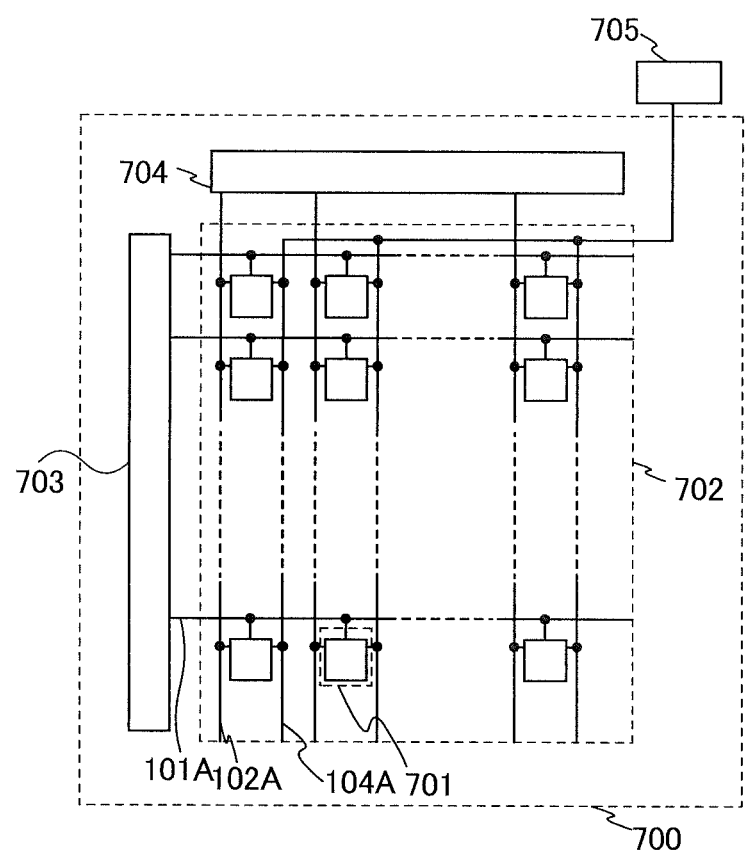
FIG. 7 is a circuit diagram of a light-emitting display device.

Note that the pixel illustrated in FIGS. 1A and 1B is placed in a matrix like a plurality of pixels 701 over a substrate 700 illustrated in FIG. 7. FIG. 7 illustrates a structure in which a pixel portion 702, a scan line driver circuit 703, and a signal line driver circuit 704 are placed over the substrate 700. Whether the pixels 701 are in a selected state or in a non-selected state is determined per row in accordance with a scan signal supplied from the first wiring 101A connected to the scan line driver circuit 703. The pixel 701 selected by the scan signal is supplied with a video voltage (also referred to as an image signal, a video signal, or video data) from the second wiring 102A connected to the signal line driver circuit 704. Moreover, the pixel 701 is connected to the power supply line 104A that is extended from a power supply circuit 705 provided outside the substrate 700.

FIG. 7 illustrates the structure in which the scan line driver circuit 703 and the signal line driver circuit 704 are provided over the substrate 700; alternatively, one of the scan line driver circuit 703 and the signal line driver circuit 704 may be provided over the substrate 700. Only the pixel portion 702 may be provided over the substrate 700. Furthermore, FIG. 7 illustrates the structure in which the power supply circuit 705 is provided outside the substrate 700; alternatively, the power supply circuit 705 may be provided over the substrate 700.

FIG. 7 illustrates an example in which the plurality of pixels 701 are arranged in a matrix (in stripe) in the pixel portion 702. Note that the pixels 701 are not necessarily arranged in a matrix and may be arranged in a delta pattern or Bayer arrangement. As a display method of the pixel portion 702, a progressive method or an interlace method can be employed. Note that color elements controlled in the pixel for color display are not limited to three colors of R (red), G (green), and B (blue), and color elements of more than three colors may be employed, for example, RGBW (W corresponds to white), or RGB added with one or more of yellow, cyan, magenta, and the like. Further, the size of display regions may be different between dots of color elements.

FIG. 7 illustrates the first wirings 101A, the second wirings 102A, and the power supply lines 104A corresponding to the number of pixels in the row direction and column direction. Note that the numbers of the first wirings 101A, the second wirings 102A, and the power supply lines 104A may be increased depending on the number of sub-pixels included in one pixel or the number of transistors in the pixel. The pixels 701 may be driven with the first wiring 101A, the second wiring 102A, and the power supply line 104A shared with some pixels.

Note that FIG. 1A illustrates the TFT in which the second wiring 102A is rectangular; alternatively, the second wiring 102A may surround the third wiring 102B (specifically, the second wiring 102A may be U-shaped or C-shaped) so that the area of a region where carriers move is increased to increase the amount of current flowing.

Note that the width of the first wiring 101A except a region to be the first thin film transistor 107A may be reduced so that the first wiring 101A is partly narrow. When the width of the first wiring is reduced, the aperture ratio of the pixel can be increased.

Note that the aperture ratio represents the area of a region through which light is transmitted, per pixel. Therefore, the aperture ratio is decreased as a region occupied by components that do not transmit light is increased, whereas the aperture ratio is increased as a region occupied by components that transmit light is increased. In a light-emitting display device, the aperture ratio is increased in such a manner that a wiring or the like that does not transmit light is placed so as not to overlap with a region occupied by a light-emitting element provided inside a partition or the size of thin film transistors is reduced.

Note that a thin film transistor is an element having at least three terminals of a gate, a drain, and a source. The thin film transistor has a channel region between a drain region and a source region, and current can flow through the drain region, the channel region, and the source region. Here, since the source and the drain of the transistor may change depending on the structure, the operating condition, and the like of the transistor, it is difficult to define which is a source or a drain. Therefore, a region functioning as a source or a drain is not called the source or the drain in some cases. In such a case, for example, one of the source and the drain is referred to as a first terminal, a first electrode, or a first region and the other of the source and the drain is referred to as a second terminal, a second electrode, or a second region in some cases.

Next, a method for manufacturing the pixel according to the top view and the cross-sectional view illustrated in FIGS. 1A and 1B will be described with reference to FIGS. 2A to 2C.

A glass substrate can be used as the light-transmitting substrate 111. FIG. 2A illustrates a structure in which the base film 112 is provided over the substrate 111 in order to prevent diffusion of impurities from the substrate 111 or improve adhesion between the substrate 111 and elements provided over the substrate 111. Note that the base film 112 is not necessarily provided.

Next, a conductive layer is formed over the entire surface of the substrate 111. After that, a first photolithography step is performed so that a resist mask is formed and unnecessary portions are removed by etching, whereby the first wiring 101A and the capacitor electrode 101B are formed. At this time, etching is performed so that at least edges of the first wiring 101A and the capacitor electrode 101B are tapered.

The first wiring 101A and the capacitor electrode 101B are preferably formed using a low-resistance conductive material such as aluminum (Al) or copper (Cu). Since the use of aluminum alone has disadvantages such as low heat resistance and a tendency to be corroded, aluminum is used in combination with a conductive material having heat resistance. As the conductive material having heat resistance, it is possible to use an element selected from titanium (Ti), tantalum (Ta), tungsten (W), molybdenum (Mo), chromium (Cr), neodymium (Nd), and scandium (Sc); an alloy containing any of these elements as its component; an alloy containing a combination of any of these elements; or a nitride containing any of these elements as its component.

Note that the wiring and the like included in the TFT can be formed by an inkjet method or a printing method. Thus, the wiring and the like can be formed at room temperature, can be formed at a low vacuum, or can be formed using a large substrate. Since the wirings and the like can be manufactured without using a photomask, a layout of the transistor can be changed easily. Further, it is not necessary to use a resist, so that material costs are reduced and the number of steps can be reduced. In addition, a resist mask and the like can also be formed by an inkjet method or a printing method. When a resist is formed only over intended portions by an inkjet method or a printing method and exposed to light and developed to form a resist mask, costs can be reduced as compared to the case where a resist is formed over the entire surface.

A resist mask having regions with a plurality of thicknesses (typically, two kinds of thicknesses) may be formed using a multi-tone mask to form wirings and the like.

Then, an insulating film (hereinafter referred to as the gate insulating film 113) is formed over the entire surface of the first wiring 101A and the capacitor electrode 101B. The gate insulating film 113 is formed by a sputtering method or the like.

For example, as the gate insulating film 113, a silicon oxide film is formed by a sputtering method. It is needless to say that the gate insulating film 113 is not limited to such a silicon oxide film and may be formed with a single-layer structure or a layered structure of another insulating film such as a silicon oxynitride film, a silicon nitride film, an aluminum oxide film, or a tantalum oxide film.

Note that before the deposition of an oxide semiconductor, dust attached to a surface of the gate insulating film 113 is preferably removed by reverse sputtering in which an argon gas is introduced to generate plasma. Note that a nitrogen atmosphere, a helium atmosphere, or the like may be used instead of an argon atmosphere. An argon atmosphere to which oxygen, $N_2O$, or the like is added may be used. Alternatively, an argon atmosphere to which $Cl_2$, $CF_4$, or the like is added may be used.

After the plasma treatment on the surface of the gate insulating film 113, an oxide semiconductor is deposited over the gate insulating film 113 without being exposed to the air. By the use of the oxide semiconductor for a semiconductor layer of the transistor, the field-effect mobility can be made higher than that of the case where a silicon-based semiconductor material such as amorphous silicon is used. Note that examples of the oxide semiconductor are zinc oxide (ZnO) and tin oxide ($SnO_2$). Moreover, In, Ga, or the like can be added to ZnO.

For the oxide semiconductor, a thin film represented by $InMO_3(ZnO)_x$ (x>0) can be used. Note that M denotes one or more of metal elements selected from gallium (Ga), iron (Fe), nickel (Ni), manganese (Mn), and cobalt (Co). For example, M denotes Ga in some cases; meanwhile, M denotes the above metal element such as Ni or Fe in addition to Ga (Ga and Ni or Ga and Fe) in other cases. Further, the above oxide semiconductor may contain a transitional metal element such as Fe or Ni or an oxide of the transitional metal as an impurity element in addition to the metal element contained as M. For example, an In—Ga—Zn—O-based film can be used as the oxide semiconductor layer.

As the oxide semiconductor ($InMO_3(ZnO)_x$ (x>0) film), an $InMO_3(ZnO)_x$ (x>0) film in which M is a different metal element may be used instead of the In—Ga—Zn—O-based film. Besides the above, the following oxide semiconductors can be used as the oxide semiconductor: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor.

Note that an In—Ga—Zn—O-based oxide semiconductor is used as the oxide semiconductor in this embodiment. Here, a target in which $In_2O_3$, $Ga_2O_3$, and ZnO are contained at ratio of 1:1:1 is used. The oxide semiconductor is deposited under the following conditions: the distance between the substrate and the target is 100 mm, the pressure is 0.6 Pa, the direct current (DC) power is 0.5 kW, and the atmosphere is an oxygen atmosphere (the flow rate of oxygen is 100%). Note that a pulsed direct current (DC) power supply is preferably used because powder substances (also referred to as particles or dust) generated in film deposition can be reduced and the film thickness can be uniform.

Note that a chamber used for depositing the oxide semiconductor may be the same or different from the chamber where the reverse sputtering is performed previously.

Examples of a sputtering method are an RF sputtering method in which a high-frequency power supply is used as a sputtering power supply, a DC sputtering method in which a direct-current power supply is used, and a pulsed DC sputtering method in which a bias is applied in a pulsed manner. An RF sputtering method is mainly used for forming an insulating film, and a DC sputtering method is mainly used for forming a metal film.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Further, there are a sputtering apparatus that is provided with a magnet system inside the chamber and employs a magnetron sputtering, and a sputtering apparatus employing an ECR sputtering in which plasma generated with the use of microwaves is used without using glow discharge.

Furthermore, examples of a deposition method by sputtering are a reactive sputtering method in which a target substance and a sputtering gas component chemically react with each other during deposition to form a thin compound film thereof, and a bias sputtering in which voltage is also applied to a substrate during deposition.

Next, the oxide semiconductor layer is subjected to dehydration or dehydrogenation. The temperature of first heat treatment for dehydration or dehydrogenation is higher than or equal to 400° C. and lower than 750° C., preferably higher than or equal to 425° C. and lower than 750° C. Note that the heat treatment may be performed for one hour or shorter when the temperature of the heat treatment is 425° C. or higher; the heat treatment is preferably performed for longer than one hour when the temperature is lower than 425° C. Here, the substrate is introduced into an electric furnace, which is one of heat treatment apparatuses, and heat treatment is performed on the oxide semiconductor layer in a nitrogen atmosphere. Then, the oxide semiconductor layer is not exposed to air, which prevents water or hydrogen from entering the oxide semiconductor layer, so that the oxide semiconductor layer is obtained. In this embodiment, slow cooling is performed in one furnace from the heating temperature T at which dehydration or dehydrogenation is performed on the oxide semiconductor layer to a temperature low enough to prevent entry of water; specifically, the slow cooling is performed in a nitrogen atmosphere until the temperature drops by 100° C. or more from the heating temperature T. Without being limited to a nitrogen atmosphere, dehydration or dehydrogenation may be performed in a rare gas atmosphere (e.g., helium, neon, or argon).

The heat treatment apparatus is not limited to an electric furnace and may be provided with a device that heats an object to be processed by thermal conduction or thermal radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that hardly reacts with an object by heat treatment, for example, nitrogen or a rare gas such as argon is used.

When the oxide semiconductor layer is subjected to heat treatment at a temperature of 400° C. or higher and lower than 750° C., dehydration or dehydrogenation of the oxide semiconductor layer can be achieved; thus, water ($H_2O$) can be prevented from being contained again in the oxide semiconductor layer in a later step.

In the first heat treatment, water, hydrogen, and the like are not preferably contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (i.e., the impurity concentration is 1 ppm or lower, preferably 0.1 ppm or lower).

Note that the oxide semiconductor layer may be crystallized to be a microcrystalline film or a polycrystalline film depending on the condition of the first heat treatment or the material of the oxide semiconductor layer. For example, the oxide semiconductor layer may be crystallized to be a microcrystalline oxide semiconductor film having a degree of crystallization of 90% or more, or 80% or more. Furthermore, the oxide semiconductor layer may be an amorphous oxide semiconductor film containing no crystalline component, depending on the condition of the first heat treatment or the material of the oxide semiconductor layer.

After the first heat treatment for dehydration or dehydrogenation, the oxide semiconductor layer becomes an oxygen-deficient type and the resistance of the oxide semiconductor layer is decreased. The carrier concentration of the oxide semiconductor layer after the first heat treatment is higher than that of the oxide semiconductor film just after being deposited, and the oxide semiconductor layer preferably has a carrier concentration of $1 \times 10^{18}/cm^3$ or higher.

Next, a second photolithography step is performed so that a resist mask is formed and unnecessary portions are removed by etching, whereby the first oxide semiconductor layer 103A and the second oxide semiconductor layer 103B formed using the oxide semiconductor are formed. The first heat treatment for the first oxide semiconductor layer 103A and the second oxide semiconductor layer 103B may be performed on the oxide semiconductor film that has not yet been processed into the island-shaped oxide semiconductor layer. Wet etching or dry etching is employed as an etching method at this time. FIG. 2A is a cross-sectional view at this stage.

Figure 2A:
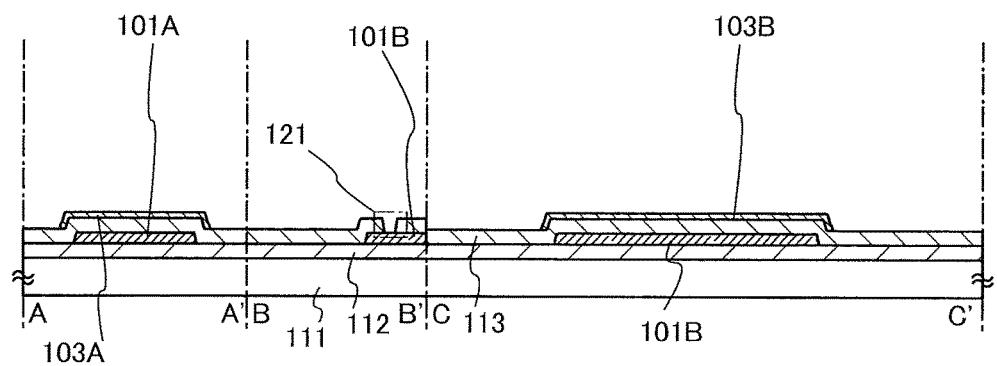
FIGS. 2A to 2C are cross-sectional views of a light-emitting display device.

Note that after the deposition of the gate insulating film 113, an opening portion 121 that reaches the capacitor electrode 101B may be formed in the gate insulating film 113 as illustrated in FIG. 2A so that a wiring to be formed later can be connected to the capacitor electrode.

Then, a conductive film is formed from a metal material over the oxide semiconductor layer by a sputtering method or a vacuum evaporation method. Examples of a material for the conductive film are an element selected from Al, Cr, Ta, Ti, Mo, and W; an alloy containing any of the above elements as its component; and an alloy containing a combination of any of the above elements. Further, in the case where heat treatment at 200° C. to 600° C. is performed, the conductive film preferably has heat resistance for such heat treatment. Since the use of Al alone brings disadvantages such as low heat resistance and a tendency to be corroded, aluminum is used in combination with a conductive material having heat resistance. As the conductive material having heat resistance which is used in combination with Al, any of the following materials can be used: an element selected from titanium (Ti), tantalum (Ta), tungsten (W), molybdenum (Mo), chromium (Cr), neodymium (Nd), and scandium (Sc); an alloy containing any of these above elements as a component; an alloy containing these elements in combination; and a nitride containing any of these above elements as a component.

Here, the conductive film has a single-layer structure of a titanium film. The conductive film may have a two-layer structure, and a titanium film may be stacked over an aluminum film. Alternatively, the conductive film may have a three-layer structure in which a Ti film, an aluminum film containing Nd (an Al—Nd film), and a Ti film are stacked in this order. The conductive film may have a single-layer structure of an aluminum film containing silicon.

Next, a third photolithography step is performed so that a resist mask is formed and unnecessary portions are removed by etching, whereby the second wiring 102A, the third wiring 102B, the power supply line 104A, and the fourth wiring 104B made of the conductive film are formed. Wet etching or dry etching is employed as an etching method at this time. For example, when a conductive film of Ti is etched with wet etching using an ammonia peroxide mixture (hydrogen peroxide of 31 wt %:ammonia of 28 wt %:water=5:2:2), the first oxide semiconductor layer 103A and the second oxide semiconductor layer 103B can be left while the second wiring 102A, the third wiring 102B, the power supply line 104A, and the fourth wiring 104B are partly etched.

An exposed region of the oxide semiconductor layer is sometimes etched in the third photolithography step depending on the etching conditions. In this case, the thickness of the first oxide semiconductor layer 103A in a region between the second wiring 102A and the third wiring 102B is smaller than that of the first oxide semiconductor layer 103A over the first wiring 101A in a region overlapping with the second wiring 102A or the third wiring 102B. Moreover, the thickness of the second oxide semiconductor layer 103B in a region between the power supply line 104A and the fourth wiring 104B is smaller than that of the second oxide semiconductor layer 103B over the capacitor electrode 101B in a region where overlapping with the power supply line 104A or the fourth wiring 104B.

Then, the oxide insulating layer 114 is formed over the gate insulating film 113, the first oxide semiconductor layer 103A, the second oxide semiconductor layer 103B, the second wiring 102A, the third wiring 102B, the power supply line 104A, and the fourth wiring 104B. At this stage, part of the first oxide semiconductor layer 103A and part of the second oxide semiconductor layer 103B are in contact with the oxide insulating layer 114. Note that a region of the first oxide semiconductor layer 103A that overlaps with the first wiring 101A and a region of the second oxide semiconductor layer 103B that overlaps with the capacitor electrode 101B, with the gate insulating film 113 therebetween, serve as channel formation regions.

The oxide insulating layer 114 can be formed to a thickness of at least 1 nm by a method with which impurities such as water or hydrogen are not mixed into the oxide insulating layer, such as a sputtering method, as appropriate. In this embodiment, a silicon oxide film is formed by a sputtering method as the oxide insulating layer. The substrate temperature in film formation is higher than or equal to room temperature and lower than or equal to 300° C., and is 100° C. in this embodiment. The silicon oxide film can be formed by a sputtering method in a rare gas (typically, argon) atmosphere, an oxygen atmosphere, or a mixed atmosphere of a rare gas (typically, argon) and oxygen. As a target, a silicon oxide target or a silicon target can be used. For example, with the use of a silicon target, a silicon oxide film can be formed by a sputtering method in an atmosphere of oxygen and a rare gas. As the oxide insulating layer which is formed in contact with the oxide semiconductor layer whose resistance is reduced, an inorganic insulating film that does not include impurities such as moisture, a hydrogen ion, and OH⁻ and blocks entry of these impurities from the outside is used. Specifically, a silicon oxide film, a silicon nitride oxide film, an aluminum oxide film, or an aluminum oxynitride film is used. Note that an oxide insulating layer formed by a sputtering method is particularly dense and even a single layer of the oxide insulating layer can be used as a protective film for preventing diffusion of impurities into a layer in contact therewith. A target doped with phosphorus (P) or boron (B) can be used so that phosphorus (P) or boron (B) is added to the oxide insulating layer.

In this embodiment, the oxide insulating layer 114 is formed by a pulsed DC sputtering method using a columnar polycrystalline, boron-doped silicon target that has a purity of 6N and a resistivity of 0.01 Ωcm in the following conditions: the distance between the substrate and the target (T-S distance) is 89 mm, the pressure is 0.4 Pa, the direct-current (DC) power supply is 6 kW, and the atmosphere is oxygen (the oxygen flow rate is 100%). The thickness of the oxide insulating layer 114 is 300 nm.

Note that the oxide insulating layer 114 is provided on and in contact with a region serving as the channel formation region of the oxide semiconductor layer and also functions as a channel protective layer.

Next, second heat treatment (preferably at 200° C. to 400° C., for example, 250° C. to 350° C.) may be performed in an inert gas atmosphere or a nitrogen atmosphere. For example, the second heat treatment is performed at 250° C. for one hour in a nitrogen atmosphere. By the second heat treatment, heat is applied while part of the first oxide semiconductor layer 103A and part of the second oxide semiconductor layer 103B are in contact with the oxide insulating layer 114.

When the second heat treatment is performed while the first oxide semiconductor layer 103A and the second oxide semiconductor layer 103B, the resistance of each of which is reduced by the first heat treatment, are in contact with the oxide insulating layer 114, a region that is in contact with the oxide insulating layer 114 becomes deficient in oxygen. Thus, the region in the first oxide semiconductor layer 103A and the second oxide semiconductor layer 103B in contact with the oxide insulating layer 114 becomes an i-type region (i.e., the resistance of the region is increased) toward the depth direction of the first oxide semiconductor layer 103A and the second oxide semiconductor layer 103B.

Then, an opening portion 122 is formed in the insulating layer 114 by a fourth photolithography method. FIG. 2B is a cross-sectional view at this stage.

Next, a light-transmitting conductive film is formed to be connected to the fourth wiring 104B. The light-transmitting conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Alternatively, an Al—Zn—O-based film containing nitrogen, that is, an Al—Zn—O—

N-based film, a Zn—O-based film containing nitrogen, or a Sn—Zn—O-based film containing nitrogen may be used. Note that the composition ratio (atomic %) of zinc in the Al—Zn—O—N-based film is less than or equal to 47 atomic % and is higher than that of aluminum in the film; the composition ratio (atomic %) of aluminum in the film is higher than that of nitrogen in the film. Such a material is etched with a hydrochloric acid-based solution. However, since a residue is easily generated particularly in etching ITO, an alloy of indium oxide and zinc oxide ($In_2O_3$—ZnO) may be used to improve etching processability.

Note that the unit of the percentage of components in the light-transmitting conductive film is atomic percent (atomic %), and the percentage of components is evaluated by analysis using an electron probe X-ray microanalyzer (EPMA).

Next, a fifth photolithography step is performed so that a resist mask is formed and unnecessary portions are removed by etching, thereby forming one of electrodes of the light-emitting element. The light-emitting element includes a pair of electrodes (an anode and a cathode) and a light-emitting layer between the pair of electrodes, and is formed by stacking elements included in the light-emitting layer over one of the pair of electrodes. Therefore, one of the pair of electrodes of the light-emitting element is referred to as the light-emitting element 105.

Next, the partition 106 for separating light-emitting elements for each pixel is provided over the first wiring 101A, the second wiring 102A, the third wiring 102B, the fourth wiring 104B, the first oxide semiconductor layer 103A, the second oxide semiconductor layer 103B, the power supply line 104A, and the capacitor electrode 101B. Note that the light-emitting element 105 connected to the fourth wiring 104B is provided inside the partition 106. FIG. 2C illustrates a cross-sectional view at this stage.

In such a manner, the pixel including the first thin film transistor 107A and the second thin film transistor 107B can be manufactured. Moreover, the pixels are arranged in a matrix to form a pixel portion, whereby an active-matrix light-emitting display device can be manufactured.

Advantages of the structure in this embodiment illustrated in FIGS. 1A and 1B and FIGS. 2A to 2C will be described in detail with reference to FIGS. 3A and 3B.

Figure 3A:
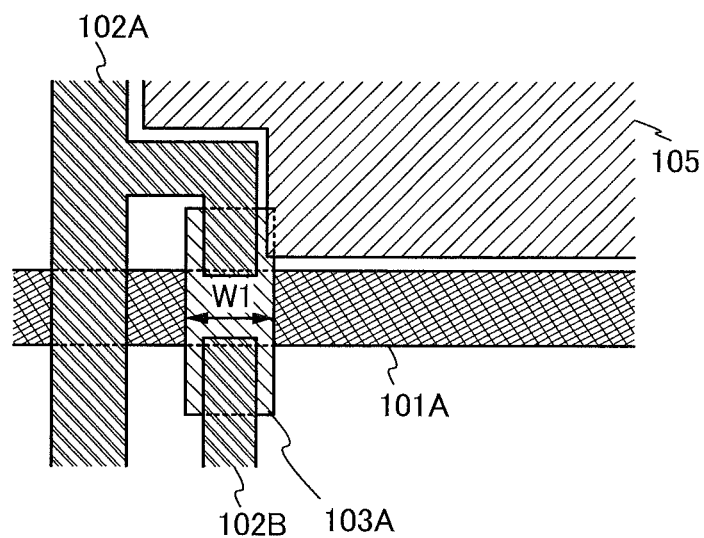
FIGS. 3A and 3B are top views each illustrating a light-emitting display device.
Figure 3B:
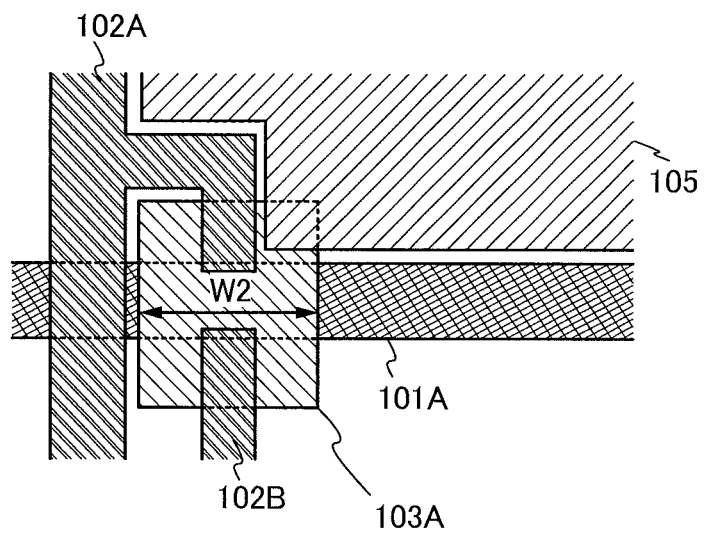

FIGS. 3A and 3B are each a magnified view of the vicinity of the oxide semiconductor layer in the top view in FIG. 1A. A diagram in which the width (W1 in FIG. 3A) of the first oxide semiconductor layer 103A in FIG. 3A is increased corresponds to FIG. 3B illustrating the width (W2 in FIG. 3B) of the first oxide semiconductor layer 103A.

As illustrated in FIGS. 3A and 3B, the first oxide semiconductor layer 103A in the top view of the pixel in FIG. 1A of this embodiment is provided over the first wiring 101A without separating another wiring from the first wiring 101A. A channel region formed in the oxide semiconductor layer between the second wiring 102A and the third wiring 102B is formed in a region overlapping the first wiring 101A. Since characteristics of the TFT might vary when light is emitted to the channel region, the first oxide semiconductor layer 103A needs to be well shielded from light by a wiring separated from the first wiring 101A, which results in a reduction in aperture ratio of the pixel. In contrast, the aperture ratio can be increased with the structure in this embodiment, in which the oxide semiconductor layer is provided so as to overlap the first wiring 101A and a wiring separated from the first wiring 101A is not formed.

Moreover, by using a light-transmitting oxide semiconductor layer as the semiconductor layer of the thin film transistor, display can be performed without a reduction in aperture ratio even if the oxide semiconductor layer is shifted from an intended region overlapping with the first wiring 101A and thus overlaps with the light-emitting element 105.

When the oxide semiconductor layer is formed with a pattern larger than a predetermined size, favorable display can be performed without a malfunction and a reduction in aperture ratio even if the oxide semiconductor layer is formed in a portion that is slightly shifted from the intended position. An active-matrix substrate for the light-emitting display device can be easily manufactured, and the yield can be increased.

Next, a specific example of a top view of the case where storage capacitance is reduced by using a thin film transistor including an oxide semiconductor layer will be described.

A current (hereinafter referred to as a leakage current) flowing through a thin film transistor including an oxide semiconductor when a gate is supplied with a voltage that makes the transistor turn off is 0.1 pA or less, whereas that of a thin film transistor including amorphous silicon is about several hundreds of nanoamperes. For that reason, in the thin film transistor including an oxide semiconductor, storage capacitance can be reduced. In other words, the degree of freedom for layout of elements in a pixel including a thin film transistor including an oxide semiconductor can be improved as compared to that in a pixel including a thin film transistor including amorphous silicon.

Figure 12A:
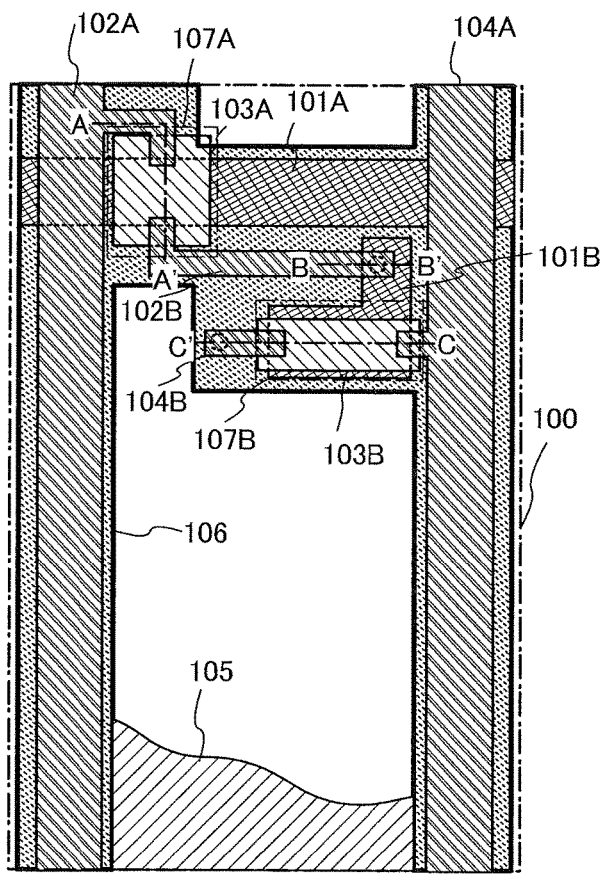
FIGS. 12A and 12B are a top view and a cross-sectional view of a light-emitting display device.
Figure 12B:
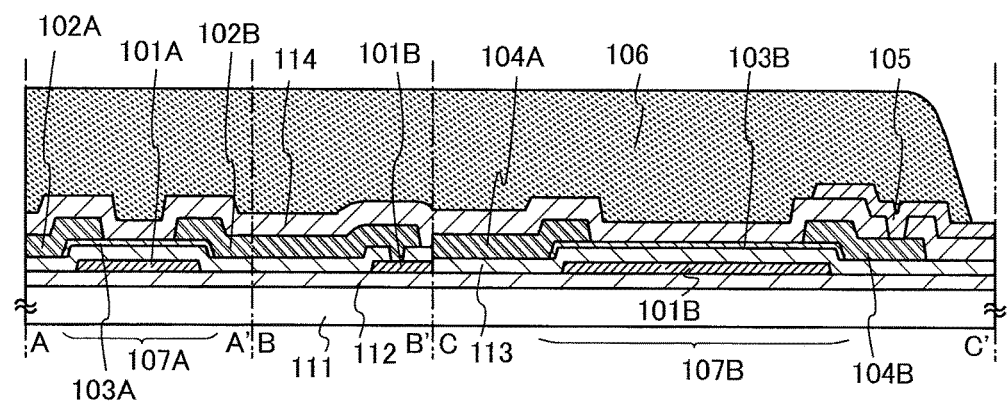

It is possible to omit a storage capacitor of a thin film transistor including an oxide semiconductor layer because the leakage current of the thin film transistor is extremely small. Specifically, FIGS. 12A and 12B illustrate a top view and a cross-sectional view in the case where a storage capacitor is omitted. The top view of a pixel illustrated in FIG. 12A corresponds to a view in which a capacitor line is eliminated from the top view in FIG. 1A. As seen from the top view in FIG. 12A and the cross-sectional view in FIG. 12B, by using a thin film transistor including an oxide semiconductor layer, the third wiring 102B and the like that are led can be shortened with the placement of the second thin film transistor; thus, the aperture ratio can be increased.

As described above, the structure described in this embodiment makes it possible to increase the aperture ratio of a pixel including a thin film transistor in which an oxide semiconductor is used. Thus, a light-emitting display device can include a high definition display portion.

This embodiment can be implemented in combination with any of the structures described in the other embodiments as appropriate.

Embodiment 2

An example in which a pixel in a display device includes a TFT having a structure different from that in Embodiment 1 will be described below.

Figure 4A:
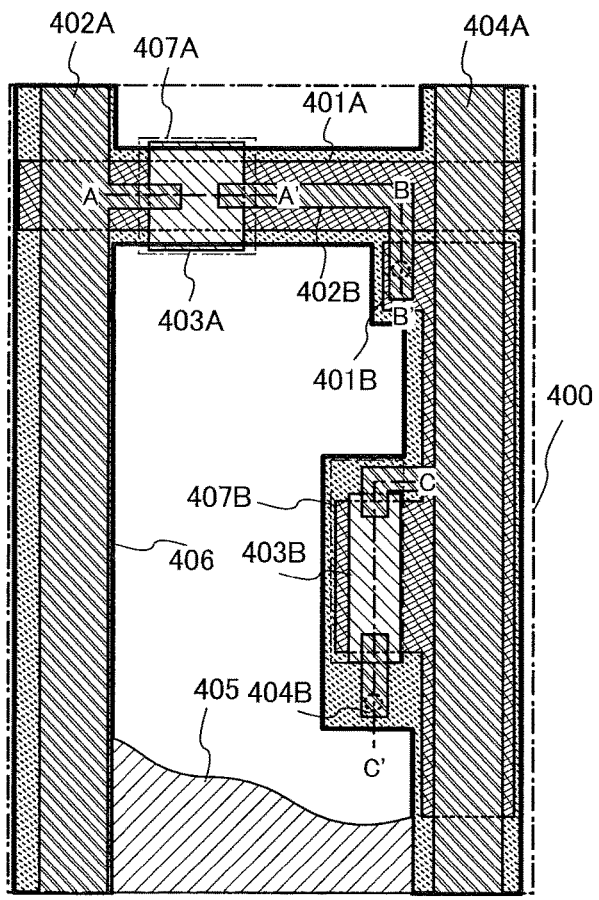
FIGS. 4A and 4B are a top view and a cross-sectional view of a light-emitting display device.

FIG. 4A is a top view of a pixel having a structure different from that in Embodiment 1. A TFT illustrated in FIG. 4A is a kind of bottom-gate structure called an inverted staggered structure in which a wiring layer serving as a source electrode and a drain electrode of the TFT is placed opposite to an oxide semiconductor layer serving as a channel region, with respect to a wiring serving as a gate.

A pixel 400 illustrated in FIG. 4A includes a first wiring 401A functioning as a scan line, a second wiring 402A functioning as a signal line, a first oxide semiconductor layer 403A, a second oxide semiconductor layer 403B, a power supply line 404A, a capacitor electrode 401B, and a light-emitting element 405. Moreover, the pixel 400 includes a third wiring 402B for electrically connecting the first oxide semiconductor layer 403A and the capacitor electrode 401B, so that a first thin film transistor 407A is formed. Furthermore, the pixel 400 includes a fourth wiring 404B for electrically connecting the second oxide semiconductor layer 403B and the light-emitting element 405, so that a second thin film transistor 407B is formed. A partition 406 for separating light-emitting elements for each pixel is provided over the first wiring 401A, the second wiring 402A, the third wiring 402B, the fourth wiring 404B, the first oxide semiconductor layer 403A, the second oxide semiconductor layer 403B, the power supply line 404A, and the capacitor electrode 401B. Note that the light-emitting element 405 connected to the fourth wiring 404B is provided inside the partition 406.

The first wiring 401A also functions as a gate of the first thin film transistor 407A. The capacitor electrode 401B is also a wiring that functions as a gate of the second thin film transistor 407B and one electrode of a storage capacitor. The second wiring 402A also functions as one of a source electrode and a drain electrode of the first thin film transistor 407A. The third wiring 402B also functions as the other of the source electrode and the drain electrode of the first thin film transistor 407A. The power supply line 404A is also a wiring that functions as one of a source electrode and a drain electrode of the second thin film transistor 407B and the other electrode of the storage capacitor. The fourth wiring 404B also functions as the other of the source electrode and the drain electrode of the second thin film transistor 407B.

Note that the first wiring 401A and the capacitor electrode 401B are formed from the same layer; the second wiring 402A, the third wiring 402B, the power supply line 404A, and the fourth wiring 404B are formed from the same layer. In addition, the power supply line 404A and the capacitor electrode 401B partly overlap with each other to form the storage capacitor of the second thin film transistor 407B. Note that the first oxide semiconductor layer 403A included in the first thin film transistor 407A is provided over the first wiring 401A with a gate insulating film (not illustrated) therebetween, and extended beyond the edge of a region where the first wiring 401A and the partition 406 are provided.

Figure 4B:
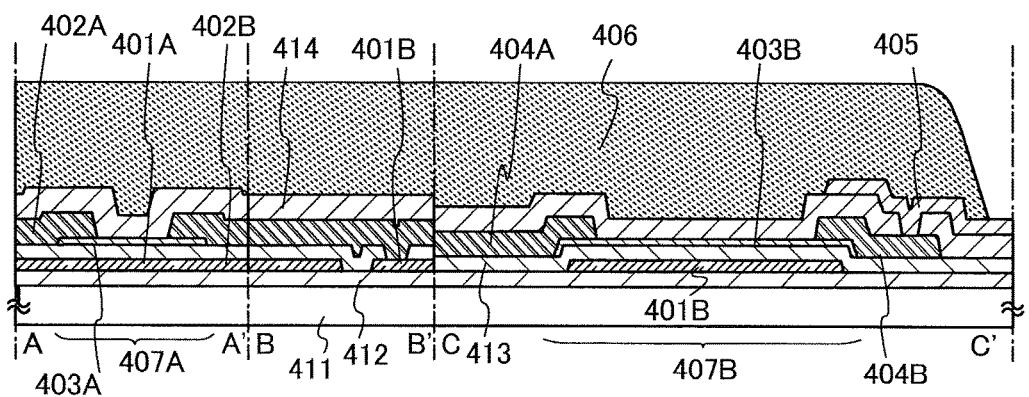

FIG. 4B illustrates a cross-sectional structure along chain lines A-A', B-B', and C-C' in FIG. 4A. In the cross-sectional structure illustrated in FIG. 4B, the first wiring 401A serving as the gate and the capacitor electrode 401B are provided over a substrate 411 with a base film 412 therebetween. A gate insulating film 413 is provided so as to cover the first wiring 401A and the capacitor electrode 401B. The first oxide semiconductor layer 403A and the second oxide semiconductor layer 403B are provided over the gate insulating film 413. The second wiring 402A and the third wiring 402B are provided over the first oxide semiconductor layer 403A, and the power supply line 404A and the fourth wiring 404B are provided over the second oxide semiconductor layer 403B. An oxide insulating layer 414 functioning as a passivation film is provided over the first oxide semiconductor layer 403A, the second oxide semiconductor layer 403B, the second wiring 402A, the third wiring 402B, the power supply line 404A, and the fourth wiring 404B. The partition 406 is provided over the oxide insulating layer 414 over the first wiring 401A, the second wiring 402A, the third wiring 402B, the fourth wiring 404B, the first oxide semiconductor layer 403A, the second oxide semiconductor layer 403B, the power supply line 404A, and the capacitor electrode 401B. An opening portion is formed in the oxide insulating layer 414 over the fourth wiring 404B. The electrode of the light-emitting element 405 and the fourth wiring 404B are connected in the opening portion. In the cross section along chain line B-B', the third wiring 402B and the capacitor electrode 401B are connected through an opening portion formed in the gate insulating film 413.

Note that as in the description of FIGS. 1A and 1B in Embodiment 1, the pixel illustrated in FIGS. 4A and 4B is placed over the substrate 700 in FIG. 7 as the plurality of pixels 701 arranged in a matrix. The description of FIG. 7 is similar to that in Embodiment 1.

Figure 2B:
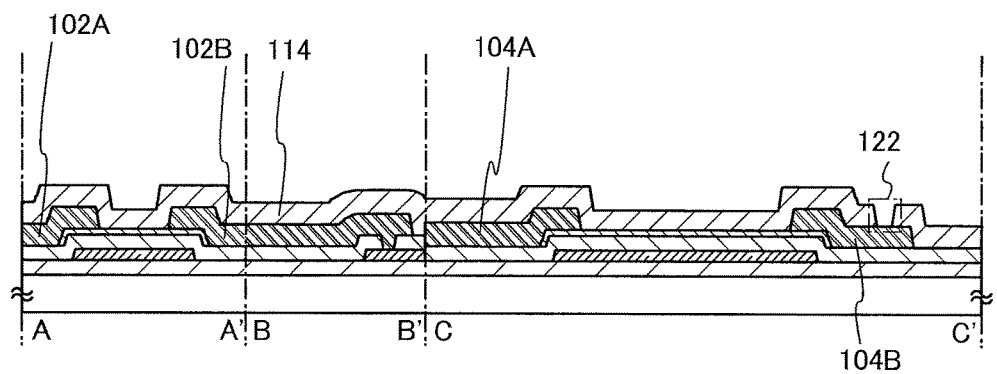
Figure 2C:
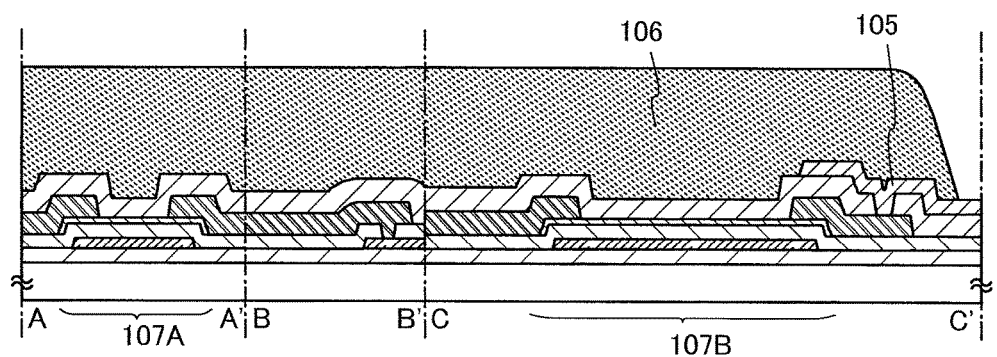

Moreover, the cross-sectional view in FIG. 4B is similar to the cross-sectional view in FIG. 1B, and the description of a method for forming a pixel is similar to the description of FIGS. 2A to 2C in Embodiment 1.

Advantages of the structure in this embodiment illustrated in FIGS. 4A and 4B will be described in detail with reference to FIGS. 5A and 5B.

Figure 5A:
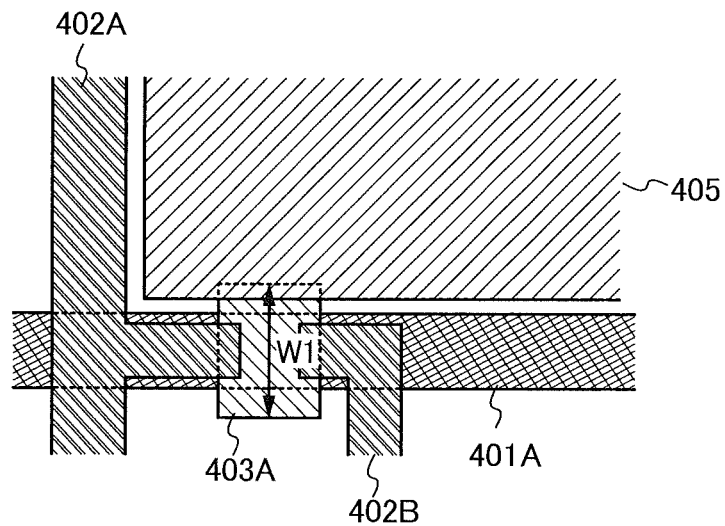
FIGS. 5A and 5B are top views each illustrating a light-emitting display device.
Figure 5B:
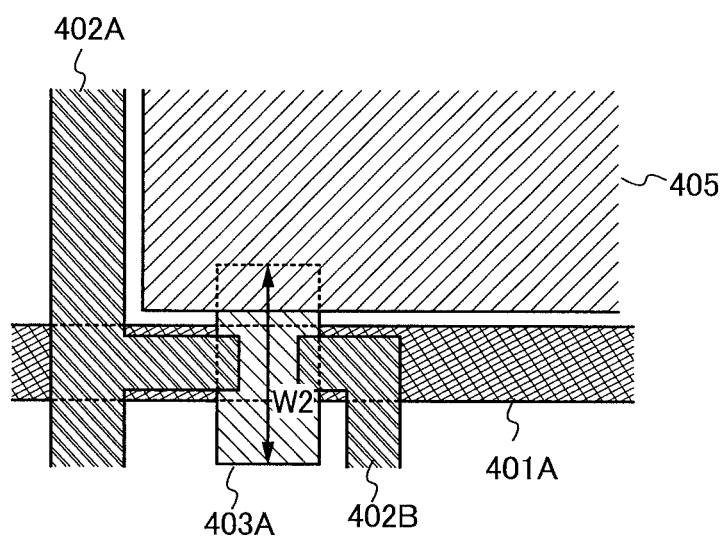

FIGS. 5A and 5B are each a magnified view of the vicinity of the oxide semiconductor layer in the top view in FIG. 4A. A diagram in which the width (W1 in FIG. 5A) of the first oxide semiconductor layer 403A in FIG. 5A is increased corresponds to FIG. 5B illustrating the width (W2 in FIG. 5B) of the first oxide semiconductor layer 403A.

As illustrated in FIGS. 5A and 5B, the first oxide semiconductor layer 403A in the top view of the pixel in FIG. 4A of this embodiment is provided over the first wiring 401A without separating another wiring from the first wiring 401A. A channel region formed in the oxide semiconductor layer between the second wiring 402A and the third wiring 402B is formed in a region overlapping the first wiring 401A. In addition, the first oxide semiconductor layer 403A in this embodiment is extended over the gate insulating film over the first wiring 401A and is in contact with the second wiring 402A and the third wiring 402B.

Since characteristics of the TFT might vary when light is emitted to the channel region, the first oxide semiconductor layer 403A needs to be well shielded from light by a wiring separated from the first wiring 401A, which results in a reduction in aperture ratio of the pixel. In contrast, the aperture ratio can be increased with the structure in this embodiment, in which the oxide semiconductor layer is provided so as to overlap the first wiring 401A and a wiring separated from the first wiring 401A is not formed; and the second wiring 402A and the third wiring 402B are extended over the gate insulating film over the first wiring 401A so as to be in contact with the first oxide semiconductor layer 403A.

Moreover, by using a light-transmitting oxide semiconductor layer as the semiconductor layer of the thin film transistor, display can be performed without a reduction in aperture ratio even if the oxide semiconductor layer is shifted from an intended region overlapping with the first wiring 401A and thus overlaps with the light-emitting element 405.

Note that the second wiring 402A and the third wiring 402B extended over the first wiring 401A illustrated in FIG. 4A overlaps the first wiring 401A. The second wiring 402A and the third wiring 402B may be placed in a meander pattern or may be provided linearly.

When the oxide semiconductor layer is formed with a pattern larger than a predetermined size, favorable display can be performed without a malfunction and a reduction in aperture ratio even if the oxide semiconductor layer is formed in a portion that is slightly shifted from the intended position. An active-matrix substrate for the light-emitting display device can be easily manufactured, and the yield can be increased.

As described above, the structure in this embodiment makes it possible to increase the aperture ratio of a pixel including a thin film transistor in which an oxide semiconductor is used. Thus, a light-emitting display device can include a high definition display portion.

This embodiment can be implemented in combination with any of the structures described in the other embodiments as appropriate.

Embodiment 3

An example in which a pixel in a display device includes a TFT having a structure different from those in Embodiments 1 and 2 will be described below.

Figure 6A:
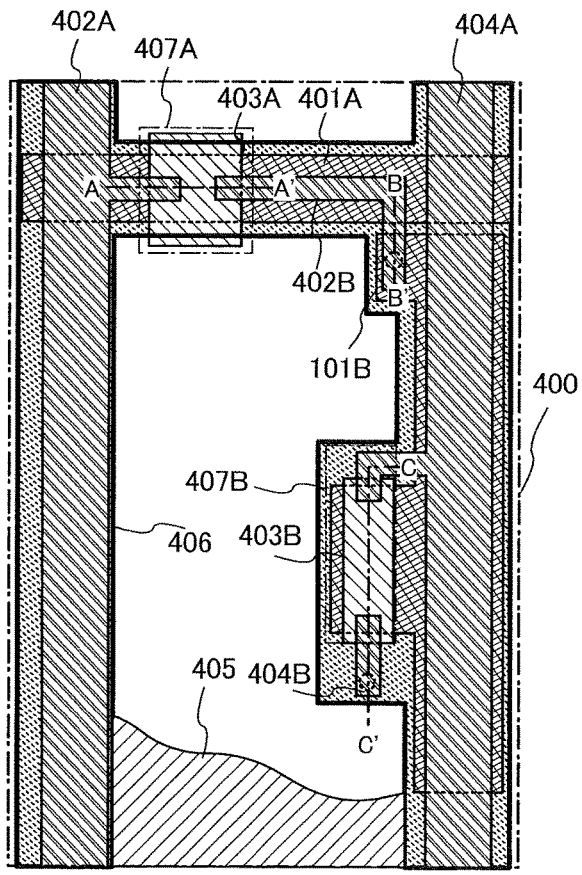
FIGS. 6A and 6B are a top view and a cross-sectional view of a light-emitting display device.
Figure 6B:
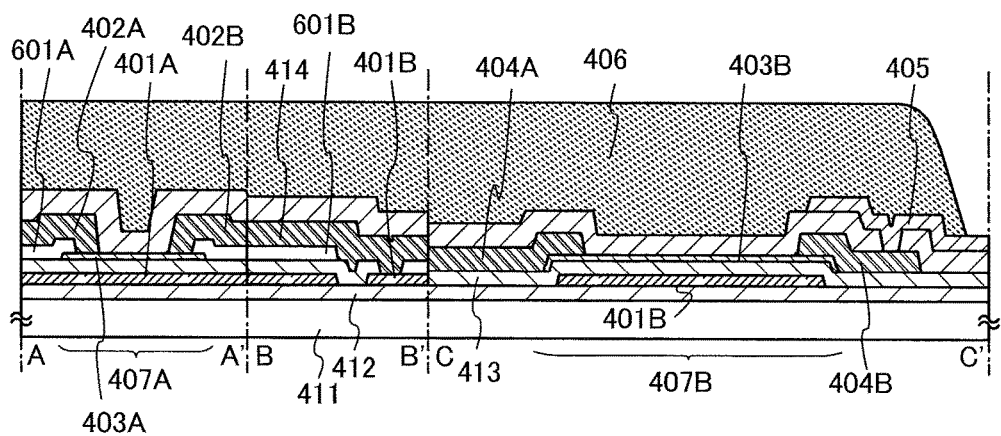

FIGS. 6A and 6B are a top view and a cross-sectional view of a pixel that has a structure different from that in Embodiment 2. Note that the structure in the top view of FIG. 6A is similar to that of FIG. 4A; therefore, the description is not repeated. The structure in the cross-sectional view of FIG. 6B is different from the structure in the cross-sectional view of FIG. 4B in that an interlayer insulating layer 601A is provided between the first wiring 401A and the second wiring 402A, and that an interlayer insulating layer 601B is provided between the first wiring 401A and the third wiring 402B.

When the second wiring 402A and the third wiring 402B are extended over the first wiring 401A, parasitic capacitance might be generated between the first wiring 401A and the second wiring 402A, between the first wiring 401A and the third wiring 402B, and between the first wiring 401A and the power supply line 404A, depending on the thickness of the gate insulating film 413. The interlayer insulating layers 601A and 601B are provided as illustrated in FIG. 6B, whereby the parasitic capacitance can be reduced and defects such as a malfunction can be reduced.

As described above, the structure described in this embodiment makes it possible to increase the aperture ratio of a pixel including a thin film transistor in which an oxide semiconductor is used. Moreover, in this embodiment, it is possible to achieve the reduction in parasitic capacitance in addition to the advantages in Embodiment 2. Thus, it is possible to provide a light-emitting display device in which a malfunction is less likely to occur and which includes a high definition display portion.

Embodiment 4

In this embodiment, a structure of a light-emitting element which is a display element will be described.

Figure 9:
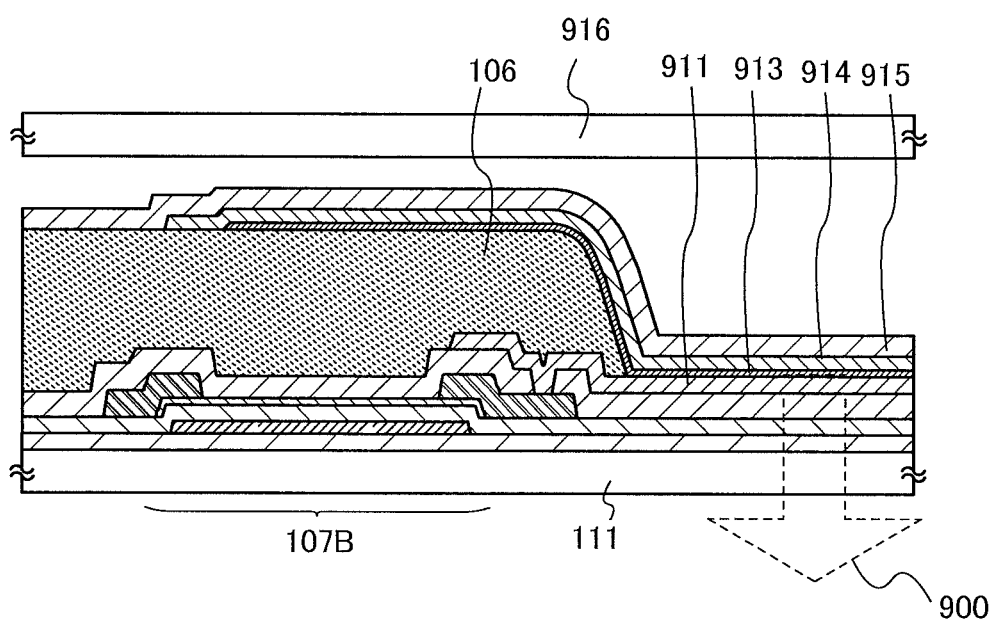
FIG. 9 is a cross-sectional view of a light-emitting display device.

FIG. 9 illustrates an embodiment of a cross-sectional structure of a light-emitting element connected to a thin film transistor. The light-emitting element is provided by a stack of a first electrode 911, an EL layer 913 including a light-emitting layer, and a second electrode 914 in this order. One of the first electrode 911 and the second electrode 914 functions as an anode and the other functions as a cathode. Holes injected from the anode and electrons injected from the cathode are recombined in the light-emitting layer included in the EL layer, whereby the light-emitting element emits light. The first electrode 911 of the light-emitting element is connected to the thin film transistor 107B formed over the substrate 111. The partition 106 is provided so as to cover the first electrode 911 and one of the electrodes serving as the source or the drain of the thin film transistor 107B. The EL layer 913 is provided in an opening portion in the partition 106 over the first electrode 911. The second electrode 914 is provided so as to cover the EL layer 913 and the partition 106. Note that the thin film transistor in Embodiment 1 is used in this embodiment; the thin film transistor shown in any of the other embodiments can be used.

The first electrode 911 or the second electrode 914 is formed using a metal, an alloy, or a conductive compound.

For example, the first electrode 911 or the second electrode 914 can be formed using a metal, an alloy, a conductive compound, or the like that has a high work function (a work function of 4.0 eV or more). Specifically, it is possible to use a layer of a light-transmitting conductive metal oxide such as indium oxide-tin oxide (ITO: indium tin oxide), indium tin oxide containing silicon or silicon oxide, indium oxide-zinc oxide (IZO: indium zinc oxide), or indium oxide containing tungsten oxide and zinc oxide (IWZO).

Moreover, the first electrode 911 or the second electrode 914 can be formed using a metal, an alloy, a conductive compound, or the like that has a low work function (typically, a work function of 3.8 eV or less). Specifically, it is possible to use any of the following materials, for example: elements that belong to Group 1 or Group 2 of the periodic table (i.e., an alkali metal such as lithium and cesium and an alkaline-earth metal such as magnesium, calcium, and strontium) and an alloy of such an element (e.g., an alloy of aluminum, magnesium, and silver and an alloy of aluminum and lithium); and a rare earth metal (e.g., europium and ytterbium) and an alloy of such an element.

A film of an alkali metal, an alkaline-earth metal, or an alloy thereof is formed by a vacuum evaporation method, a sputtering method, or the like. Further, silver paste or the like can be applied by an inkjet method and baked to form the first electrode 911 or the second electrode 914. The first electrode 911 and the second electrode 914 are not limited to a single layer and can have a layered structure.

In order to extract light emitted from the EL layer to the outside, one of or both the first electrode 911 and the second electrode 914 is/are formed so as to transmit light emitted from the EL layer. When only the first electrode 911 has light-transmitting properties, light passes the first electrode 911 in the direction shown by an arrow 900 and is extracted from the substrate 111 side with a luminance corresponding to a video signal input from a signal line. When only the second electrode 914 has light-transmitting properties, light passes the second electrode 914 and is extracted from the sealing substrate 916 side with a luminance corresponding to a video signal input from a signal line. When both the first electrode 911 and the second electrode 914 have light-transmitting properties, light passes the first electrode 911 and the second electrode 914 and is extracted from both the substrate 111 side and the sealing substrate 916 side with a luminance corresponding to a video signal input from a signal line.

For example, the light-transmitting electrode is formed using a light-transmitting conductive metal oxide or formed to a thickness of several nanometers to several tens of nanometers by using silver, aluminum, or the like. Alternatively, the light-transmitting electrode can have a layered structure including a thin layer of metal such as silver or aluminum and a conductive metal oxide layer with light-transmitting properties.

One of the first electrode 911 and the second electrode 914 that serves as the anode is preferably formed using a metal, an alloy, a conductive compound, or the like that has a high work function (a work function of 4.0 eV or more). The other of the first electrode 911 and the second electrode 914 that serves as the cathode is preferably formed using a metal, an alloy, a conductive compound, or the like that has a low work function (a work function of 3.8 eV or less). Typically, the electrode serving as the cathode can be formed using an alkali metal, an alkaline-earth metal, an alloy or a compound containing such a metal; or transition metal (including a rare earth metal in its category).

The EL layer 913 includes the light-emitting layer. The EL layer 913 may include a hole-injection layer, a hole-transport layer, an electron-transport layer, and an electron-injection layer in addition to the light-emitting layer. The hole-transport layer is provided between the anode and the light-emitting layer. The hole-injection layer is provided between the anode and the light-emitting layer or between the anode and the hole-transport layer. The electron-transport layer is provided between the cathode and the light-emitting layer. The electron-injection layer is provided between the cathode and the light-emitting layer or between the cathode and the electron-transport layer. Note that all the hole-injection layer, the hole-transport layer, the electron-transport layer, and the electron-injection layer are not necessarily provided, and a layer to be provided is selected as appropriate in accordance with a desired function or the like.

The light-emitting layer contains a light-emitting substance. As a light-emitting substance, a fluorescent compound that exhibits fluorescence or a phosphorescent compound that exhibits phosphorescence can be used, for example.

The light-emitting layer can be formed by dispersing a light-emitting substance in a host material. When the light-emitting layer is formed by dispersion of a light-emitting substance in a host material, it is possible to suppress crystallization and concentration quenching in which quenching reaction occurs between light-emitting substances.

When the light-emitting substance is a fluorescent compound, a substance having singlet excitation energy (energy difference between a ground state and a singlet excited state) higher than that of the fluorescent compound is preferably used as the host material. When the light-emitting substance is a phosphorescent compound, a substance having triplet excitation energy (the energy difference between a ground state and a triplet excited state) higher than that of the phosphorescent compound is preferably used as the host material.

As the light-emitting substance dispersed in the host material, a phosphorescent compound or a fluorescent compound can be used.

Note that for the light-emitting layer, two or more kinds of host materials and a light-emitting substance may be used, or two or more kinds of light-emitting substances and a host material may be used. Alternatively, two or more kinds of host materials and two or more kinds of light-emitting substances may be used.

As the hole-injection layer, a layer that contains a substance having a high hole-transport property and a substance having an electron-accepting property can be used. The layer that contains a substance having a high hole-transport property and a substance having an electron-accepting property has a high carrier density and an excellent hole-injection property. In addition, when the layer that contains a substance having a high hole-transport property and a substance having an electron-accepting property is used as the hole-injection layer in contact with the electrode functioning as the anode, various kinds of metals, alloys, conductive compounds, mixtures thereof, or the like can be used regardless of the work function of a material of the electrode functioning as the anode The light-emitting layer, the hole-injection layer, the hole-transport layer, the electron-transport layer, and the electron-injection layer can be formed by an evaporation method, a coating method, or the like.

A passivation layer 915 may be formed over the second electrode 914 and the partition 106 by a sputtering method or a CVD method. The placement of the passivation layer 915 can reduce deterioration of the light-emitting element due to entry of moisture and oxygen into the light-emitting element from the outside. A space between the passivation layer 915 and the sealing substrate 916 may be filled with nitrogen, and further, a drying agent may be placed. Alternatively, a space between the passivation layer 915 and the sealing substrate 916 may be filled with a light-transmitting organic resin with high water absorbability.

When the light-emitting element emits white light, the substrate 111 or the sealing substrate 916 can be provided with a color filter, a color conversion layer, or the like so that full-color display can be performed.

The substrate 111 or the sealing substrate 916 may be provided with a polarizing plate or a circular polarizing plate in order to enhance the contrast.

With a combination of the pixel in this embodiment with the structure in any of Embodiments 1 to 3, it is possible to increase the aperture ratio of the pixel including a thin film transistor in which an oxide semiconductor is used.

This embodiment can be implemented in combination with any of the structures described in the other embodiments as appropriate.

Embodiment 5

In this embodiment, a circuit configuration of a pixel that can be applied to a light-emitting display device will be described.

Figure 8:
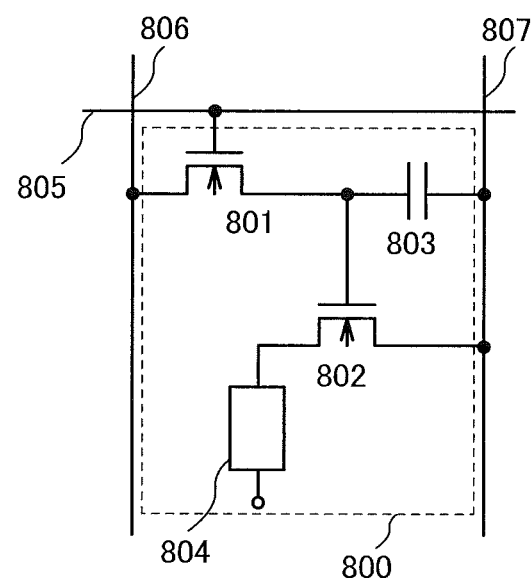
FIG. 8 is a circuit diagram of a light-emitting display device.

FIG. 8 illustrates an example of a pixel configuration that can be applied to the light-emitting display device. A pixel 800 includes a first thin film transistor 801, a second thin film transistor 802, a capacitor 803, and a light-emitting element 804. A gate of the first thin film transistor 801 is electrically connected to a first wiring 805. A first terminal of the first thin film transistor 801 is electrically connected to a second wiring 806. A second terminal of the first thin film transistor 801 is electrically connected to a first electrode of the capacitor 803 and a gate of the second thin film transistor 802. A second electrode of the capacitor 803 is electrically connected to a power supply line 807. A first terminal of the second thin film transistor 802 is electrically connected to the power supply line 807. A second terminal of the second thin film transistor 802 is electrically connected to one electrode of the light-emitting element 804.

The first wiring 805 has a function similar to that of the first wiring 101A in Embodiment 1. The second wiring 806 has a function similar to that of the second wiring 102A in Embodiment 1. The power supply line 807 has the same function as the power supply line 104A in Embodiment 1. The light-emitting element 804 has the same structure as the light-emitting element described in Embodiment 4.

With a combination of the pixel in this embodiment with the structure in any of Embodiments 1 to 4, it is possible to increase the aperture ratio of the pixel including a thin film transistor in which an oxide semiconductor is used.

This embodiment can be implemented in combination with any of the structures described in the other embodiments as appropriate.

Embodiment 6

In this embodiment, an example of an electronic device including the light-emitting display device described in any of Embodiments 1 to 5 will be described.

Figure 10A:
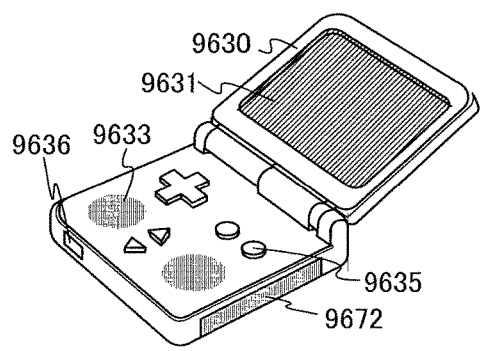
FIGS. 10A to 10C each illustrate an electronic device.

FIG. 10A illustrates a portable game machine that can include a housing 9630, a display portion 9631, a speaker 9633, operation keys 9635, a connection terminal 9636, a recording medium insert reading portion 9672, and the like. The portable game machine in FIG. 10A has a function of reading a program or data stored in the recording medium to display it on the display portion, a function of sharing information with another portable game machine by wireless communication, and the like. Note that the portable game machine in FIG. 10A can have a variety of functions without being limited to the above.

Figure 10B:
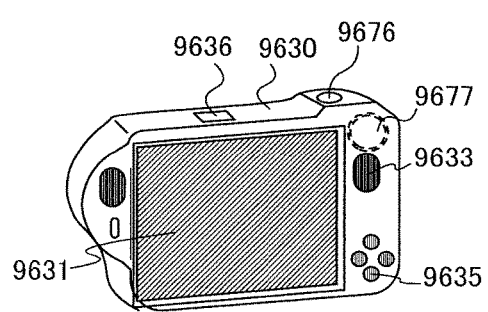

FIG. 10B illustrates a digital camera that can include the housing 9630, the display portion 9631, the speaker 9633, the operation keys 9635, the connection terminal 9636, a shutter button 9676, an image receiving portion 9677, and the like. The digital camera having a television reception function in FIG. 10B has various functions such as a function of photographing a still image and/or a moving image; a function of automatically or manually correcting the photographed image; a function of obtaining various kinds of information from an antenna; and a function of displaying the photographed image or the information obtained from the antenna on the display portion. Note that the digital camera having the television reception function in FIG. 10B can have a variety of functions without being limited to the above.

Figure 10C:
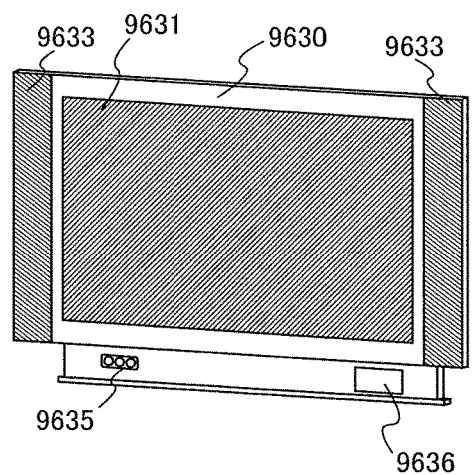

FIG. 10C illustrates a television set that can include the housing 9630, the display portion 9631, the speakers 9633, the operation key 9635, the connection terminal 9636, and the like. The television set in FIG. 10C has a function of converting an electric wave for television into an image signal, a function of converting the image signal into a signal suitable for display, a function of converting a frame frequency of the image signal, and the like. Note that the television set in FIG. 10C can have a variety of functions without being limited to the above.

Figure 11A:
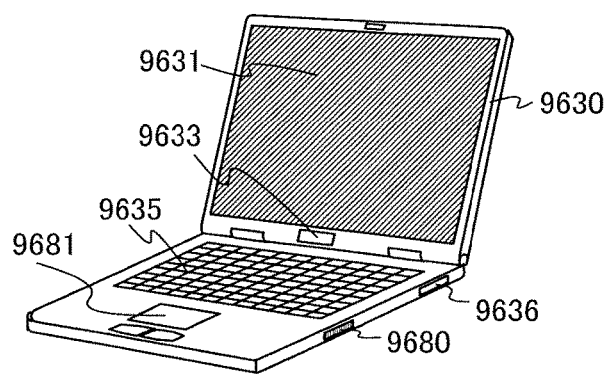
FIGS. 11A to 11C each illustrate an electronic device.

FIG. 11A illustrates a computer that can include the housing 9630, the display portion 9631, the speaker 9633, the operation keys 9635, the connection terminal 9636, an external connection port 9680, a pointing device 9681, and the like. The computer in FIG. 11A can have a function of displaying a variety of information (e.g., a still image, a moving image, and a text image) on the display portion, a function of controlling processing by a variety of software (programs), a communication function such as wireless communication or wired communication, a function of being connected to various computer networks with the communication function, a function of transmitting or receiving a variety of data with the communication function, and the like. Note that the computer in FIG. 11A is not limited to having these functions and can have a variety of functions.

Figure 11B:
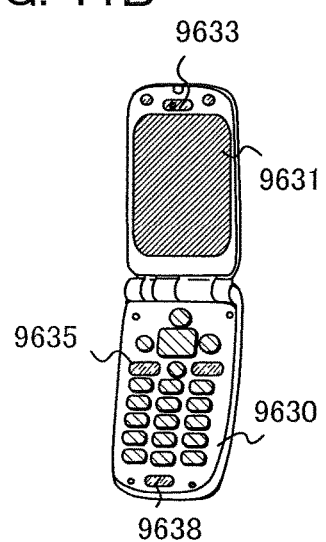

FIG. 11B illustrates a mobile phone that can include the housing 9630, the display portion 9631, the speaker 9633, the operation keys 9635, a microphone 9638, and the like. The mobile phone in FIG. 11B can have a function of displaying a variety of information (e.g., a still image, a moving image, and a text image) on the display portion; a function of displaying a calendar, a date, the time, or the like on the display portion; a function of operating or editing the information displayed on the display portion; a function of controlling processing by various kinds of software (programs); and the like. Note that the functions of the mobile phone in FIG. 11B are not limited to those described above, and the mobile phone can have various functions.

Figure 11C:
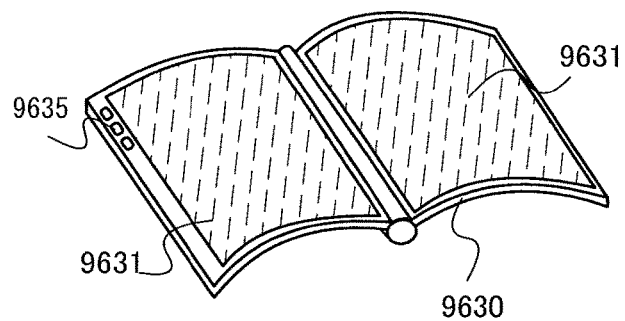

FIG. 11C illustrates an electronic device including electronic paper (also referred to as an eBook or an e-book reader) that can include the housing 9630, the display portion 9631, the operation key 9635, and the like. The e-book reader in FIG. 11C can have a function of displaying a variety of information (e.g., a still image, a moving image, and a text image) on the display portion; a function of displaying a calendar, a date, the time, and the like on the display portion; a function of operating or editing the information displayed on the display portion; a function of controlling processing by various kinds of software (programs); and the like. Note that the e-book reader in FIG. 11C can have a variety of functions without being limited to the above.

In the electronic device described in this embodiment, the aperture ratio of a plurality of pixels included in the display portion can be increased.

This embodiment can be implemented in combination with any of the structures described in the other embodiments as appropriate.

This application is based on Japanese Patent Application serial No. 2009-235180 filed with Japan Patent Office on Oct. 9, 2009, the entire contents of which are hereby incorporated by reference.

The invention claimed is:
1. A display device comprising:
a first scan line;
a second scan line;
a signal line;
a first pixel comprising a first transistor, a first pixel electrode, and a part of the first scan line; and
a second pixel adjacent to the first pixel, comprising a second transistor, a second pixel electrode, and a part of the second scan line,
wherein, in the first transistor, a gate is electrically connected to the first scan line, and one of a source and a drain is electrically connected to the signal line,
wherein, in the second transistor, a gate is electrically connected to the second scan line, and one of a source and a drain is electrically connected to the signal line,
wherein the first transistor comprises an oxide semiconductor layer, the oxide semiconductor layer being over the first scan line with a gate insulating film therebetween, and
wherein the oxide semiconductor layer extends across a side edge of the first scan line, overlaps with the second pixel electrode, and does not overlap with the first pixel electrode.

2. The display device according to claim 1, wherein the oxide semiconductor layer is electrically insulated from the second pixel electrode.

3. The display device according to claim 1, wherein the oxide semiconductor layer extends across the side edge of the first scan line in a channel width direction of the first transistor.

4. The display device according to claim 1, wherein the oxide semiconductor layer extends across the side edge of the first scan line in a channel length direction of the first transistor.

5. The display device according to claim 1, wherein the first pixel further comprises a third transistor.

6. The display device according to claim 1, wherein the display device is a light-emitting display device.

7. The display device according to claim 1,
wherein the first scan line comprises a first region overlapping the oxide semiconductor layer and a second region not overlapping the oxide semiconductor layer, and
wherein a width of the first scan line at the first region and a width of the first scan line at the second region are substantially same.

8. A display device comprising:
a first scan line;
a second scan line;
a signal line;
a first pixel comprising a first transistor, a second transistor, a first pixel electrode, a light-emitting layer, and a part of the first scan line; and
a second pixel adjacent to the first pixel, comprising a third transistor, a second pixel electrode, and a part of the second scan line,
wherein, in the first transistor, a gate is electrically connected to the first scan line, and one of a source and a drain is electrically connected to the signal line,
wherein, in the second transistor, a gate is electrically connected to one of the source and the drain of the first transistor, and one of a source and a drain is electrically connected to the first pixel electrode,
wherein, in the third transistor, a gate is electrically connected to the second scan line, and one of a source and a drain is electrically connected to the signal line,
wherein the light-emitting layer is electrically connected to the first pixel electrode,
wherein the first transistor comprises an oxide semiconductor layer, the oxide semiconductor layer being over the first scan line with a gate insulating film therebetween, and
wherein the oxide semiconductor layer extends across a side edge of the first scan line, overlaps with the second pixel electrode, and does not overlap with the first pixel electrode.

9. The display device according to claim 8, wherein the oxide semiconductor layer is electrically insulated from the second pixel electrode.

10. The display device according to claim 8, wherein the oxide semiconductor layer extends across the side edge of the first scan line in a channel width direction of the first transistor.

11. The display device according to claim 8, wherein the oxide semiconductor layer extends across the side edge of the first scan line in channel length direction of the first transistor.

12. The display device according to claim 8,
wherein the first scan line comprises a first region overlapping the oxide semiconductor layer and a second region not overlapping the oxide semiconductor layer, and
wherein a width of the first scan line at the first region and a width of the first scan line at the second region are substantially same.

13. The display device according to claim 8,
wherein the first pixel further comprises a first wiring,
wherein the first wiring is in contact with the oxide semiconductor layer and is electrically connected to the second transistor,
wherein at least a part of the first wiring overlaps the first scan line.

14. The display device according to claim 8,
wherein the first pixel further comprises a first wiring and a second wiring,
wherein the first wiring is in contact with the oxide semiconductor layer and is electrically connected to the second wiring,
wherein the first scan line and the second wiring comprise the same material, and
wherein the second wiring is configured to be the gate of the second transistor.

15. The display device according to claim 14, further comprising a power source line, wherein the second wiring does not overlap the power source line.

* * * * *